(12) United States Patent
Kamata

(10) Patent No.: US 11,823,752 B2
(45) Date of Patent: *Nov. 21, 2023

(54) MEMORY DEVICES FOR PROGRAM VERIFY OPERATIONS

(71) Applicant: MICRON TECHNOLOGY, INC., Boise, ID (US)

(72) Inventor: Yoshihiko Kamata, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/095,711

(22) Filed: Jan. 11, 2023

(65) Prior Publication Data

US 2023/0154554 A1    May 18, 2023

Related U.S. Application Data

(63) Continuation of application No. 17/463,645, filed on Sep. 1, 2021, now Pat. No. 11,562,799.

(60) Provisional application No. 63/129,693, filed on Dec. 23, 2020.

(51) Int. Cl.
    *G11C 16/04*    (2006.01)
    *G11C 16/34*    (2006.01)
    *G11C 16/10*    (2006.01)

(52) U.S. Cl.
    CPC ...... *G11C 16/3459* (2013.01); *G11C 16/0483* (2013.01); *G11C 16/10* (2013.01)

(58) Field of Classification Search
    CPC . G11C 16/3459; G11C 16/0483; G11C 16/10; G11C 11/5628; G11C 16/22; G11C 16/24; G11C 16/32

USPC .................................................. 365/185.22
See application file for complete search history.

(56) References Cited

U.S. PATENT DOCUMENTS

| | | | |
|---|---|---|---|
| 7,839,669 B2 * | 11/2010 | Hoya | G11C 11/22 365/207 |
| 8,897,071 B2 * | 11/2014 | Chandrasekhar | G11C 16/0483 365/185.01 |
| 10,121,531 B2 | 11/2018 | Yamada | |
| 10,255,977 B2 | 4/2019 | Shimizu et al. | |
| 2009/0273978 A1 * | 11/2009 | Fukuda | G11C 16/3404 365/185.24 |
| 2012/0170372 A1 * | 7/2012 | Chandrasekhar | G11C 16/0483 365/185.18 |

(Continued)

*Primary Examiner* — Tha-O H Bui
(74) *Attorney, Agent, or Firm* — Dicke, Billig & Czaja, PLLC

(57) ABSTRACT

Memory devices might include an array of memory cells, a plurality of access lines connected to the array of memory cells, a plurality of data lines connected to the array of memory cells, a plurality of shield lines, and control logic. The plurality of shield lines might be interleaved with the plurality of data lines. The control logic might be configured to implement a program verify operation of respective memory cells of the array of memory cells connected to a selected access line including charging the plurality of shield lines to a first voltage level, discharging the plurality of shield lines to a voltage level less than the first voltage level, and sensing a voltage level on each data line to determine whether each respective memory cell coupled to the selected access line has been programmed to a target level for the respective memory cell.

20 Claims, 14 Drawing Sheets

(56) References Cited

U.S. PATENT DOCUMENTS

2020/0402563 A1    12/2020   Guo et al.

\* cited by examiner

MEMORY DEVICES FOR PROGRAM VERIFY OPERATIONS

RELATED APPLICATIONS

This Application is a Continuation of U.S. application Ser. No. 17/463,645, titled "MEMORY DEVICES FOR PROGRAM VERIFY OPERATIONS," filed Sep. 1, 2021, issued as U.S. Pat. No. 11,562,799 on, Jan. 24, 2023, which is commonly assigned and incorporated herein by reference in its entirety and which claims the benefit of U.S. Provisional Application No. 63/129,693, filed on Dec. 23, 2020, hereby incorporated herein in its entirety by reference.

TECHNICAL FIELD

The present disclosure relates generally to memory and, in particular, in one or more embodiments, the present disclosure relates to memory devices for multi-level program verify operations.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). As an example, the erased state in SLC might be represented by any threshold voltage less than or equal to 0V, while the programmed data state might be represented by any threshold voltage greater than 0V.

MLC uses more than two Vt ranges, where each Vt range indicates a different data state. As is generally known, a margin (e.g., a certain number of volts), such as a dead space, may separate adjacent Vt ranges, e.g., to facilitate differentiating between data states. Multiple-level cells can take advantage of the analog nature of traditional non-volatile memory cells by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In programming MLC memory, data values are often programmed using more than one pass, e.g., programming one or more digits in each pass. For example, in four-level MLC (typically referred to simply as MLC), a first digit, e.g., a least significant bit (LSB), often referred to as lower page (LP) data, may be programmed to the memory cells in a first pass, thus resulting in two (e.g., first and second) threshold voltage ranges. Subsequently, a second digit, e.g., a most significant bit (MSB), often referred to as upper page (UP) data may be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) may represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data may be programmed to the memory cells in a first pass, resulting in two threshold voltage ranges, followed by the UP data and the XP data in a second pass, resulting in eight threshold voltage ranges. Similarly, sixteen-level MLC (typically referred to as QLC) may represent a bit pattern of four bits, and 32-level MLC (typically referred to as PLC) may represent a bit pattern of five bits.

During a program verify operation, the threshold voltages of memory cells being programmed are sensed to determine whether the memory cells have been programmed to their target threshold voltages. Typically, for a MLC memory, a sense operation for each threshold voltage (e.g., level) is used to determine whether the memory cells have been programmed to their target threshold voltages. As the number of levels increase, the number of these sense operations during a program verify operation may also increase, thereby increasing the overall programming time of the memory cells.

DETAILED DESCRIPTION

Figure 1:
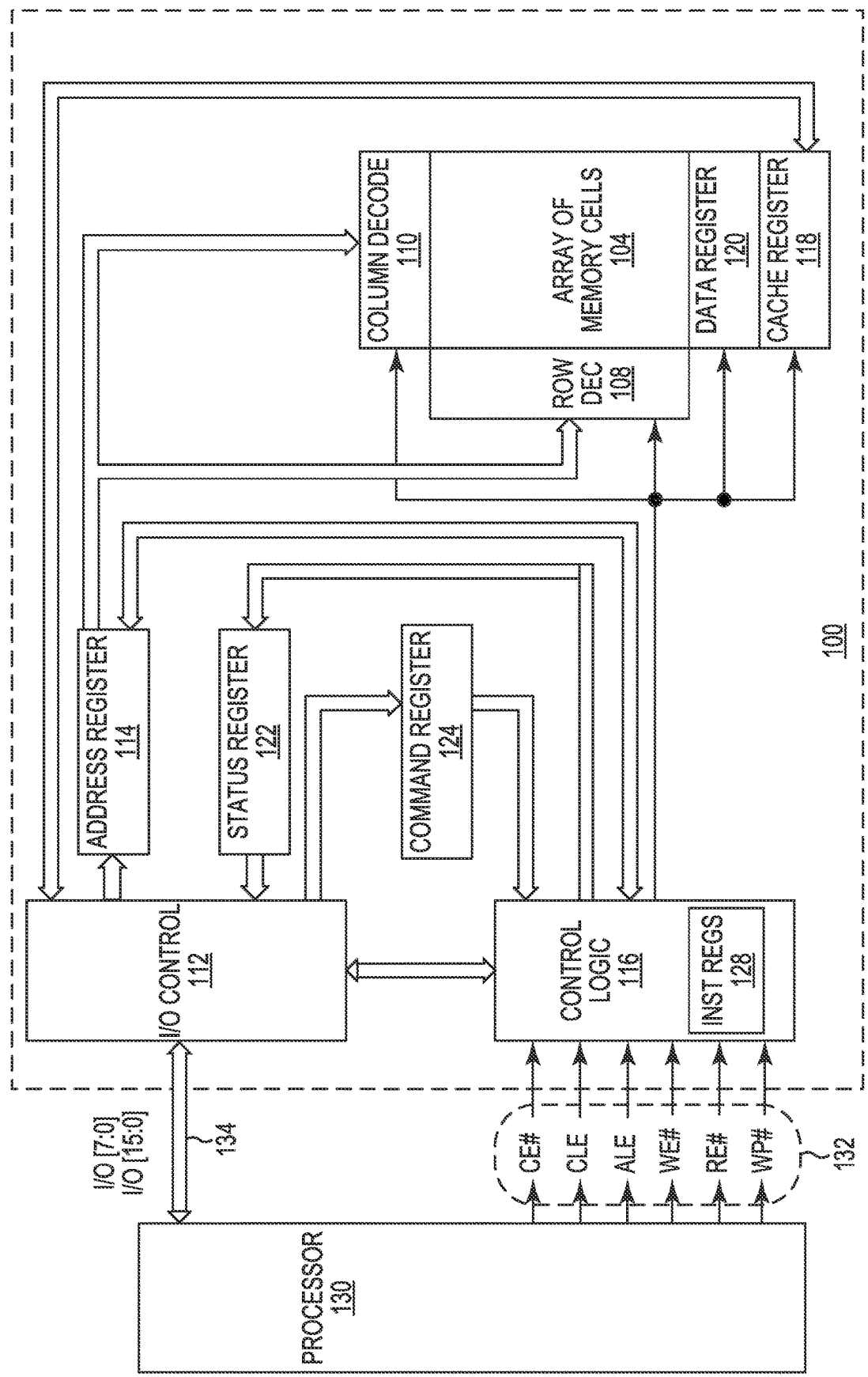
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
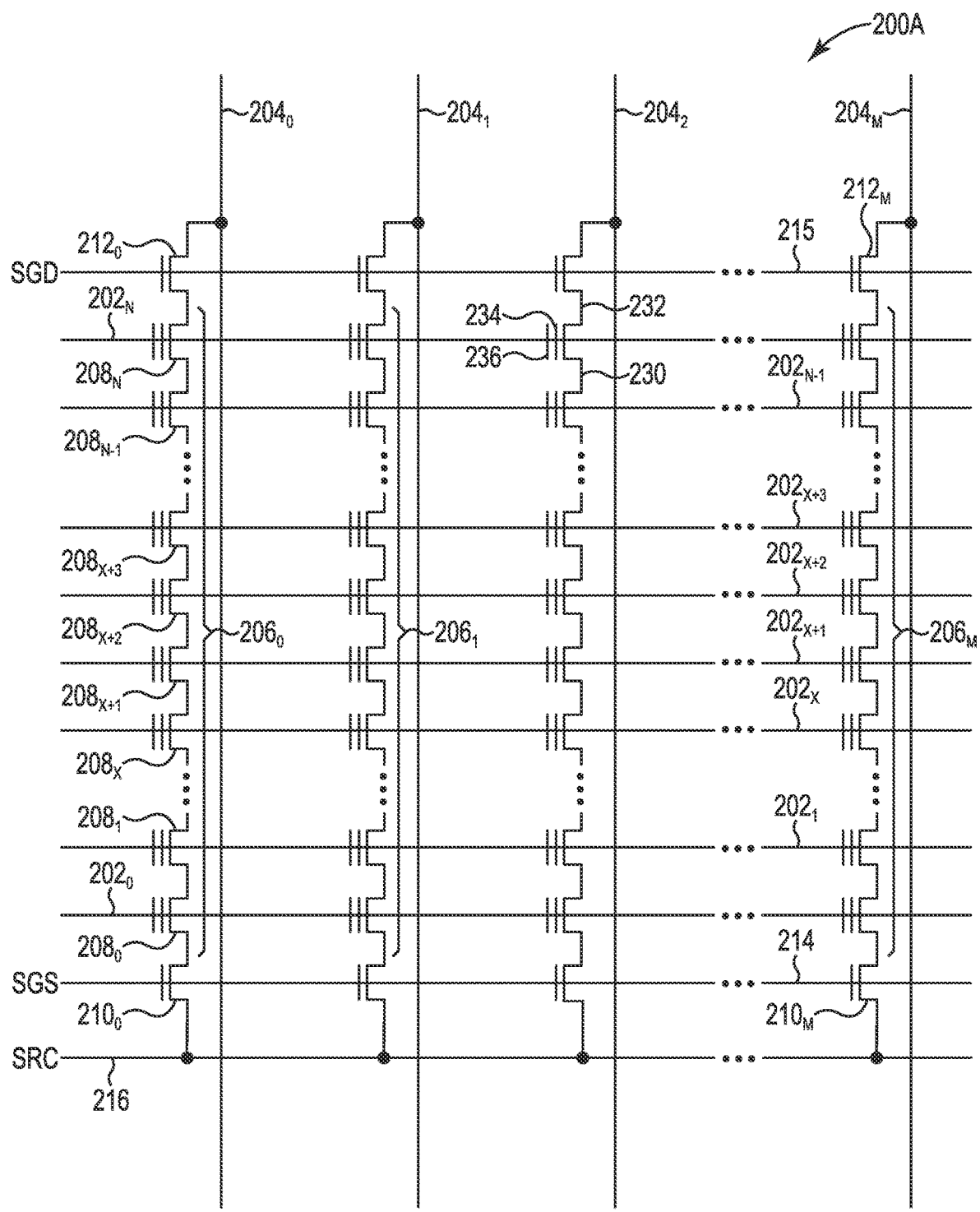
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
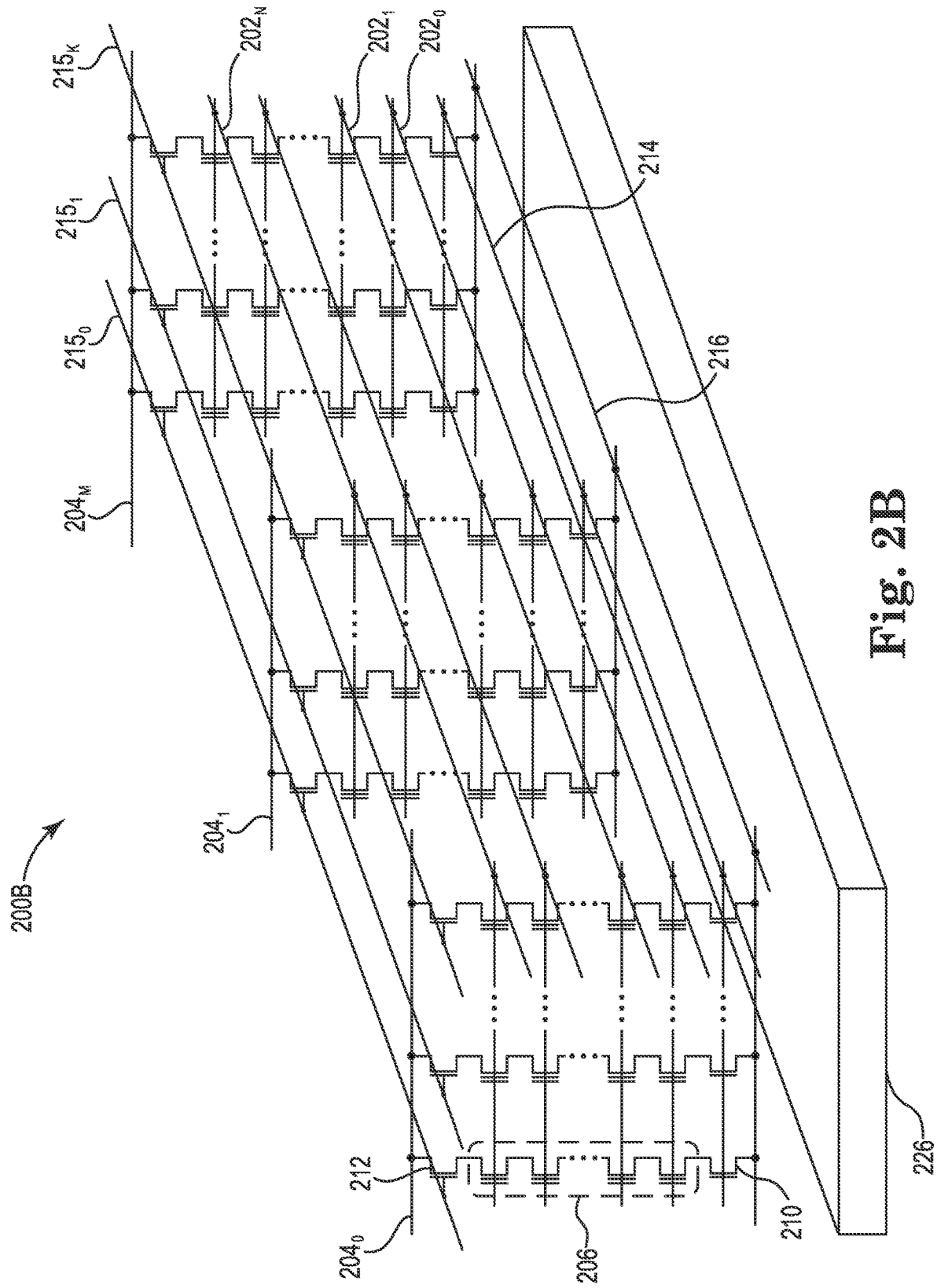

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$ to $204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$ to $215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
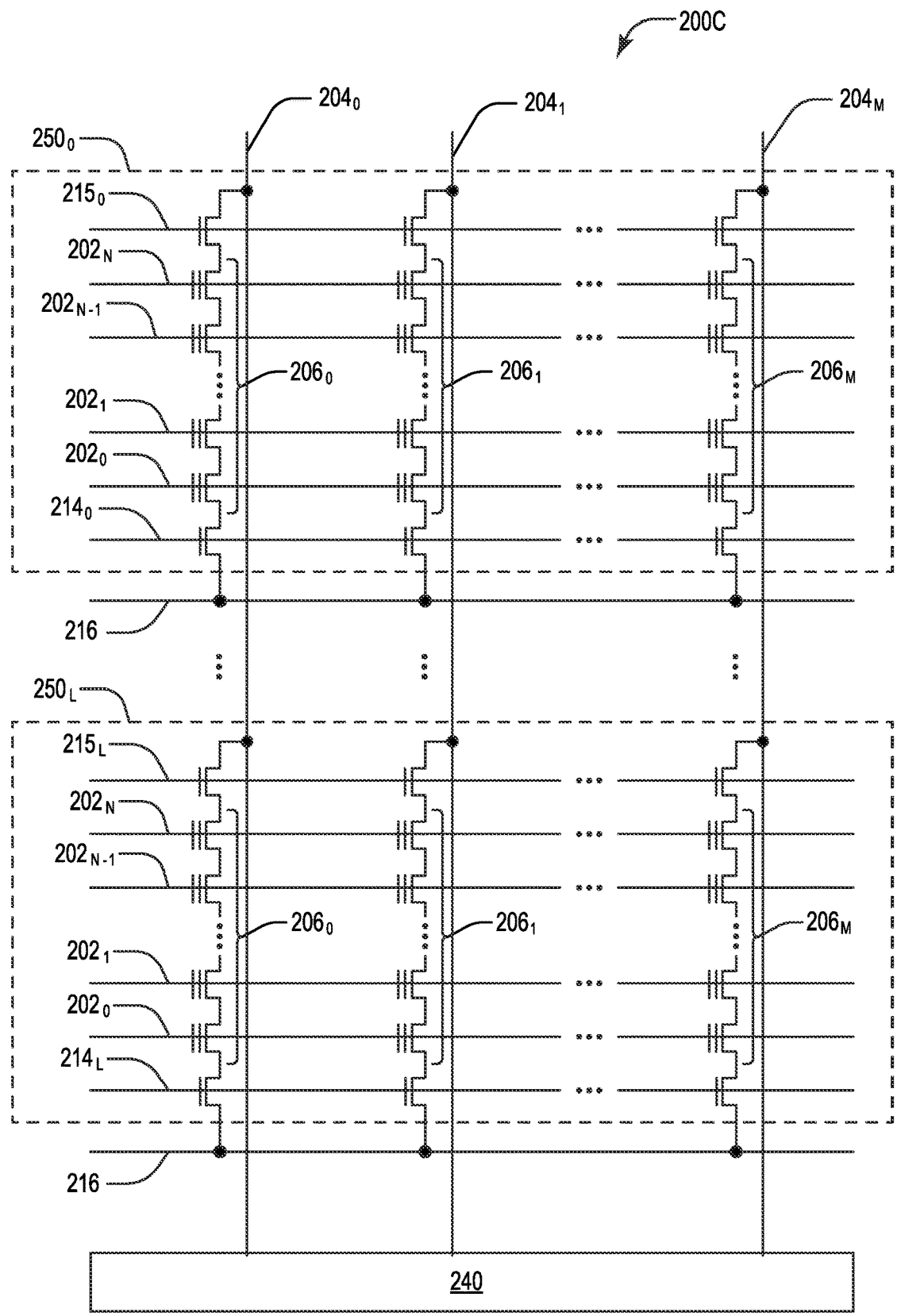

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$ to $250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$ to $250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$ to $250_L$.

The data lines $204_0$ to $204_M$ may be connected (e.g., selectively connected) to a buffer portion 240, which might be a portion of a data buffer of the memory. The buffer portion 240 might correspond to a memory plane (e.g., the set of blocks of memory cells $250_0$ to $250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$ to $215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3:
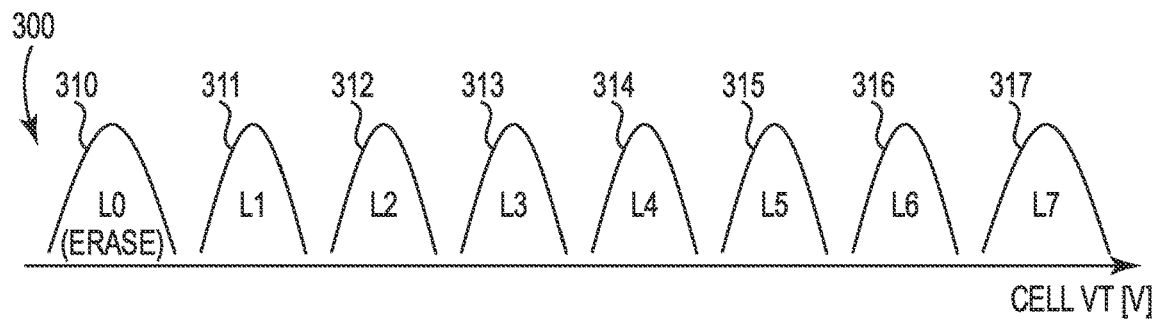
FIG. 3 depicts memory cell populations for a TLC memory according to an embodiment.

FIG. 3 depicts memory cell populations 300 for a memory according to an embodiment. For simplicity, FIG. 3 and the following FIGS. 4-10A will presume programming operations for TLC memory cells, e.g., eight-level memory cells representing data states L0, L1, L2, L3, L4, L5, L6, and L7 using eight threshold voltage ranges, each representing a data state corresponding to a bit pattern of three digits. While discussed in reference to TLC memory cells, programming operations performed on lower storage density memory cells, e.g., SLC (two data states) or higher storage density memory cells, e.g., QLC (16 data states) or PLC (32 data states) memory cells, are equally applicable.

In this example, the population of memory cells 310 might be erased memory cells and represent a logical data value of '111', the population of memory cells 311 might represent a logical data value of '011', the population of memory cells 312 might represent a logical data value of '001', the population of memory cells 313 might represent a logical data value of '101', the population of memory cells 314 might represent a logical data value of '100', the population of memory cells 315 might represent a logical data value of '000', the population of memory cells 316 might represent a logical data value of '010', and the population of memory cells 317 might represent a logical data value of '110', where the right-most digit might represent the lower page data for a memory cell having a threshold voltage within the threshold voltage range of its respective population of memory cells, the center digit might represent the upper page data for that memory cell, and the left-most digit might represent the extra page data for that memory cell. Although a specific example of binary representation is provided, embodiments may use other arrangements of bit patterns to represent the various data states.

Figure 4:
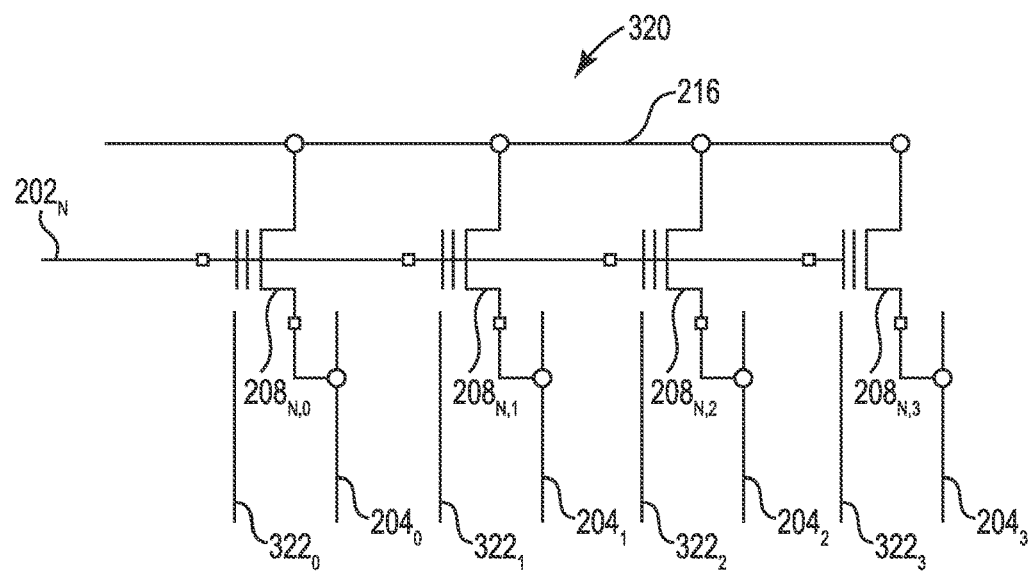
FIG. 4 is a schematic of a portion of an array of memory cells as could be used in a memory of the type described with reference to FIG. 1.

FIG. 4 is a schematic of a portion of an array of memory cells 320 as could be used in a memory of the type described with reference to FIG. 1, e.g., as a portion of array of memory cells 104. Like numbered elements in FIG. 4 correspond to the description as provided with respect to FIG. 2A. FIG. 4 depicts four selected memory cells $208_{N,0}$ to $208_{N,3}$ connected to a selected access line $202_N$ during a program verify operation. While FIG. 4 includes four selected memory cells for simplicity, in other embodiments any number of memory cells may be selected, such as a physical page of memory cells. During a program verify operation, the selected memory cells $208_{N,0}$ to $208_{N,3}$ are electrically connected to the common source 216 (e.g., via the other unselected memory cells within each respective NAND string $206_0$ to $206_3$ and the respective activated select gates $210_0$ to $210_3$ as depicted in FIG. 2A). The selected memory cells $208_{N,0}$ to $208_{N,3}$ are also electrically connected to respective data lines $204_0$ to $204_3$ (e.g., via respective activated select gates $212_0$ to $212_3$).

The array of memory cells might also include a plurality of shield lines $322_0$ to $322_3$ interleaved with the data lines $204_0$ to $204_3$. The shield lines $322_0$ to $322_3$ and the data lines $204_0$ to $204_3$ might be arranged in the same plane within the memory device. The shield lines $322_0$ to $322_3$ are capacitively coupled to the data lines $204_0$ to $204_3$, respectively. Each data line 204 is also capacitively coupled to an adjacent data line. The capacitive coupling ratio between a data line (e.g., $204_1$) and a shield line (e.g., $322_1$) is greater than the capacitive coupling ratio between a first data line (e.g., $204_1$) and a second data line (e.g., $204_2$). In one example, the capacitive coupling ratio between a first data line and a second (e.g., adjacent) data line may be within a range between 1% and 20%, and the capacitive coupling ratio between a data line and a shield line may be within a range between 70% and 90%. In other examples, the capacitive coupling ratio between a first data line and a second data line and the capacitive coupling ratio between a data line and a shield line may be within other suitable ranges.

Each selected memory cell $208_{N,0}$ to $208_{N,3}$ may be programmed to a different level, i.e., threshold voltage. For example, memory cell $208_{N,0}$ may be programmed to a first threshold voltage corresponding to level L1, memory cell $208_{N,1}$ may be programmed to a second threshold voltage corresponding to level L2, memory cell $208_{N,2}$ may be programmed to a third threshold voltage corresponding to level L3, and memory cell $208_{N,3}$ may be programmed to a fourth threshold voltage corresponding to level L4. During a program verify operation, the common source 216 may be biased to a first voltage (e.g., Vcc) and the selected access line $202_N$ may be biased to a second voltage (e.g., a voltage equal to the program verify threshold voltage for level L4).

Figure 5:
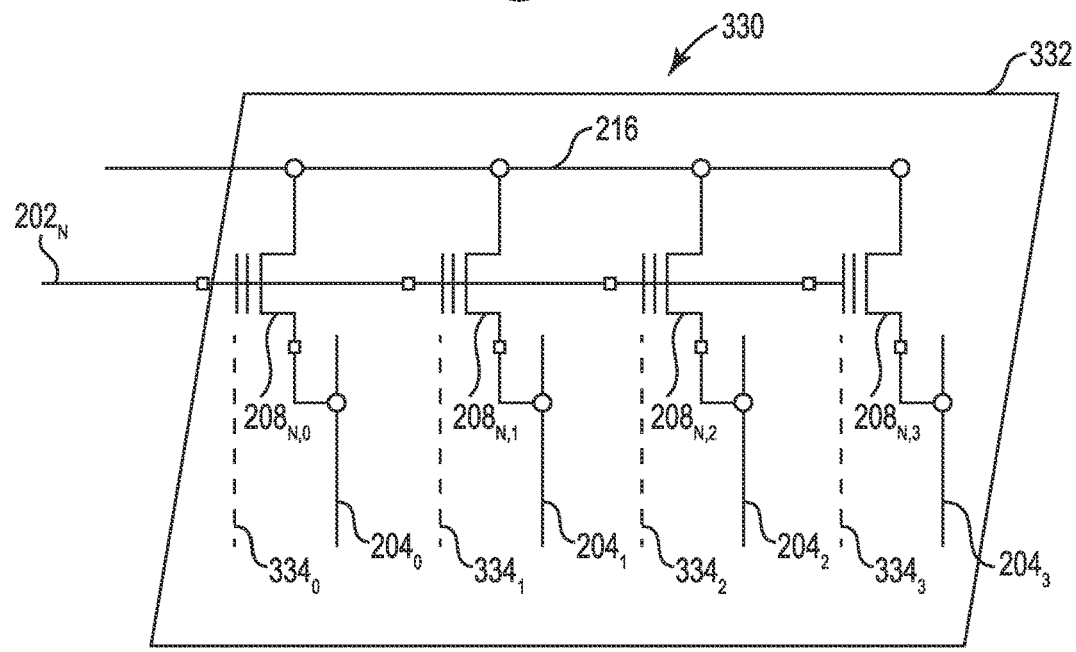
FIG. 5 is a schematic of a portion of an array of memory cells as could be used in a memory of the type described with reference to FIG. 1.

FIG. 5 is a schematic of a portion of an array of memory cells 330 as could be used in a memory of the type described with reference to FIG. 1, e.g., as a portion of array of memory cells 104. Array of memory cells 330 is similar to array of memory cells 320 previously described and illustrated with reference to FIG. 4, except that in array of memory cells 330, a shield plate 332 might be used in place of shield lines $322_0$ to $322_3$. In addition, a plurality of air gaps $334_0$ to $334_3$ might be interleaved with the data lines $204_0$ to $204_3$. The air gaps $334_0$ to $334_3$ and the data lines $204_0$ to $204_3$ might be arranged in the same plane within the memory device. The shield plate 332 might be arranged in a first plane of the memory device, and the data lines $204_0$ to $204_3$ might be arranged in a second plane of the memory device parallel to the first plane. The first plane might be above the second plane.

The shield plate 332 is capacitively coupled to each data line $204_0$ to $204_3$. Each data line 204 is also capacitively coupled to an adjacent data line as previously described. The capacitive coupling ratio between each data line $204_0$ to $204_3$ and the shield plate 332 is greater than the capacitive coupling ratio between a first data line (e.g., $204_1$) and a second data line (e.g., $204_2$). In one example, the capacitive coupling ratio between a first data line and a second (e.g., adjacent) data line may be within a range between 1% and 20%, and the capacitive coupling ratio between each data line and the shield plate 332 may be within a range between 70% and 90%. In other examples, the capacitive coupling ratio between a first data line and a second data line and the capacitive coupling ratio between each data line and the shield plate may be within other suitable ranges.

Figure 6:
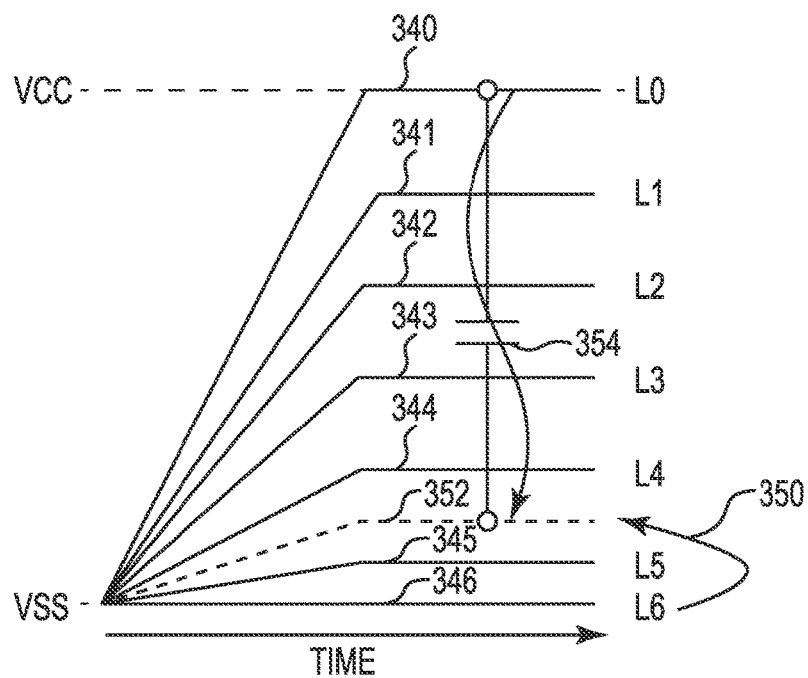
FIG. 6 depicts voltages on data lines connected to selected memory cells programmed to different threshold voltages during a program verify operation according to an embodiment.

FIG. 6 depicts voltages on data lines connected to selected memory cells programmed to different threshold voltages during a program verify operation according to an embodiment. A source follower sensing method may be used where the array of memory cells is biased as described with reference to FIGS. 4 and 5 during a program verify operation. During the program verify operation, the common source is biased to a first voltage (e.g., Vcc) and the selected access line is biased to a second voltage (e.g., a voltage greater than or equal to the target threshold voltages being sensed). In this example, the voltages on seven data lines connected to seven selected memory cells each having a different threshold voltage corresponding to levels L0, L1, L2, L3, L4, L5, and L6 are illustrated. In other embodiments, however, the selected memory cells may include more than seven levels or less than seven levels.

During a program verify operation, the voltage on each data line starts from a reference voltage (e.g., Vss) and is then precharged through the selected memory cell such that a voltage indicative of the threshold voltage of the selected memory cell appears on the data line. That is, the voltage applied to the selected access line minus the threshold voltage of the selected memory cell appears on the respective data line absent any up or down coupling due to capacitive coupling between adjacent data lines or between each data line and an adjacent shield line or the shield plate. Thus in this example, the voltage that appears on each data line varies between the reference voltage (e.g., Vss) for a selected memory cell programmed to level L6 (or level L7 not shown) that is turned off (due to a threshold voltage higher than the voltage applied to the selected access line) as indicated by trace 346 and the voltage applied to the common source for a selected memory cell programmed to level L0 having the lowest threshold voltage (e.g., 0V) as indicated by trace 340. The voltage on a data line for a selected memory cell programmed to level L1 is indicated by trace 341. The voltage on a data line for a selected memory cell programmed to level L2 is indicated by trace 342. The voltage on a data line for a selected memory cell programmed to level L3 is indicated by trace 343. The voltage on a data line for a selected memory cell pro-grammed to level L4 is indicated at 344. The voltage on a data line for a selected memory cell programmed to level L5 is indicated at 345.

Due to capacitive coupling between adjacent data lines, however, as indicated for example by capacitor 354 between a data line connected to a selected memory cell programmed to level L0 and an adjacent data line connected to a selected memory cell programmed to level L6, as indicated by arrow 350, the voltage that appears on the data line connected to the selected memory cell programmed to level L6 increases as indicated by dashed trace 352. The increase in the voltage on the data line corresponds to the capacitive coupling ratio and might contribute to a sensed memory cell threshold voltage error. For example, if the capacitive coupling ratio between adjacent data lines equals 10% and the voltage on the data line connected to the selected memory cell programmed to level L0 is precharged to 2.5V, then the voltage on the data line connected to a selected memory cell programmed to level L6 may be increased by 250 mV. This increase in the voltage on the data line might degrade the accuracy of sensing the level of the selected memory cell. While one example between adjacent data lines connected to selected memory cells programmed to levels L0 and L6 is illustrated, the capacitive coupling effects are applicable to any adjacent data lines connected to selected memory cells programed to different levels. As described below with reference to FIG. 7, embodiments disclosed herein address the capacitive coupling effects between adjacent data lines to improve sensing accuracy.

Figure 7:
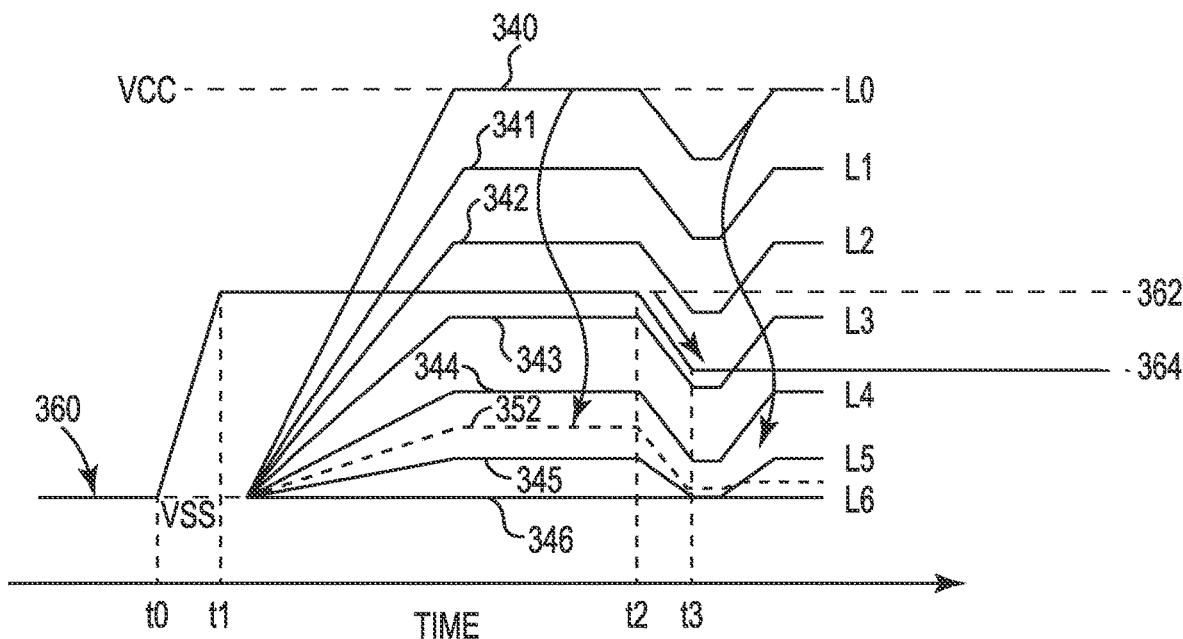
FIG. 7 depicts voltages on data lines connected to selected memory cells programmed to different threshold voltages during a program verify operation according to another embodiment.

FIG. 7 depicts voltages on data lines connected to selected memory cells programmed to different threshold voltages during a program verify operation according to another embodiment to improve sensing accuracy. To improve sensing accuracy, the capacitive coupling between the shield lines or a shield plate and the data lines may be utilized to reduce the sensed memory cell threshold voltage error due to the capacitive coupling between adjacent data lines. Trace 360 indicates the voltage applied to the shield lines (e.g., 322 of FIG. 4) or the shield plate (e.g., 332 of FIG. 5). In this example during a program verify operation, between times t0 and t1, the shield lines or the shield plate are charged to a first voltage level as indicated at 362. The first voltage level is between the reference voltage (e.g., Vss) and the voltage applied to the common source (e.g., Vcc), such as, for example, (Vss+Vcc)/2.

After time t1, with the shield lines or the shield plate charged to the first voltage level 362, the data lines are precharged through the selected memory cells as described with reference to FIG. 6. Between times t2 and t3, the shield lines or the shield plate are discharged to a second voltage level as indicated at 364. The second voltage level 364 is less than the first voltage level 362. Due to the capacitive coupling between each data line and the shield lines or the shield plate, the voltage on each data line is also reduced. In the example of capacitive coupling between a data line connected to a selected memory cell programmed to level L0 and a data line connected to a selected memory cell programmed to level L6, the voltage on the data line connected to the selected memory cell programmed to level L6 as indicated by trace 352 is also reduced. After time t3, the data lines are recharged. Due to the capacitive coupling between adjacent data lines, however, the increase in voltage on the data line connected to the selected memory cell programmed to level L6 remains lower after time t3 than before time t2, thereby suppressing the sensed memory cell threshold voltage error. The voltage on the shield lines or the shield plate may be further discharged to further suppress the sensed memory cell threshold voltage error.

In a specific example, the capacitive coupling ratio between adjacent data lines might be 10%, the capacitive coupling ratio between each data line and the shield lines or the shield plate might be 80%, and the voltage on the data line connected to the selected memory cell programmed to level L0 might be precharged to 2.5V. Thus, the voltage on the data line connected to a selected memory cell programmed to level L6 may be increased by 250 mV before time t2 as indicated by trace 352. The shield lines or the shield plate might be charged to 1.5V. The shield lines or the shield plate might then be driven down between times t2 and t3 by 300 mV such that the second voltage 364 equals 1.2V. Thus, the voltage on each data line would be reduced by 300 mV times 80%, which equals 240 mV between times t2 and t3. Each data line is then recharged by 240 mV after time t3. Therefore, the data line connected to the selected memory cell programmed to level L6 increases by 240 mV times 10%, which equals 24 mV. Accordingly, the sensed memory cell threshold voltage error due to the capacitive coupling between adjacent data lines is suppressed from 250 mV (prior to time t2) down to 24 mV (after time t3).

Figure 8:
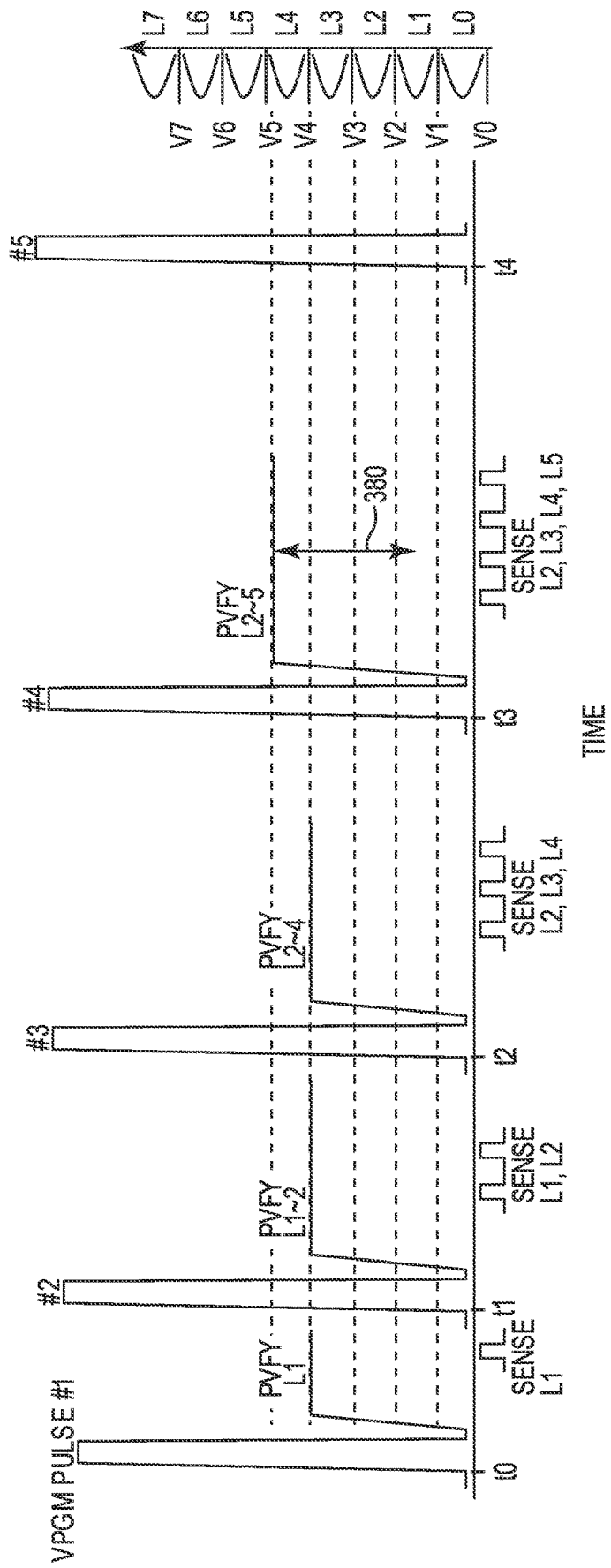
FIG. 8 is a timing diagram depicting a portion of a programming operation to program selected TLC memory cells to target threshold voltages according to an embodiment.

FIG. 8 is a timing diagram depicting a portion of a programming operation to program selected TLC memory cells to target levels L0 to L7 corresponding to threshold voltages V0 to V7 according to an embodiment. Once a selected memory cell has been programmed to its target level, the memory cell is inhibited from further programming. Prior to time t0, memory cells selected for programming might be erased such that the selected memory cells each have a threshold voltage V0 corresponding to level L0. At time t0, a first program pulse is applied to the selected access line connected to the control gates of the selected memory cells. After the first program pulse, a program verify operation is performed as described with reference to FIG. 7 to verify whether a target population of the selected memory cells has been programmed to level L1. For this program verify operation, the voltage applied to the selected access line may equal the threshold voltage V4 for level L4. At time t1, a second program pulse, e.g., higher than the first program pulse, is applied to the selected access line connected to the control gates of the selected memory cells. After the second program pulse, a program verify operation is performed to verify whether target populations of the selected memory cells have been programmed to level L1 or L2. For this program verify operation, the voltage applied to the selected access line may equal the threshold voltage V4 for level L4.

At time t2, a third program pulse, e.g., higher than the second program pulse, is applied to the selected access line connected to the control gates of the selected memory cells. After the third program pulse, a program verify operation is performed to verify whether target populations of the selected memory cells have been programmed to level L2, L3, or L4. For this program verify operation, the voltage applied to the selected access line may equal the threshold voltage V4 for level L4. At time t3, a fourth program pulse, e.g., higher than the third program pulse, is applied to the selected access line connected to the control gates of the selected memory cells. After the fourth program pulse, a program verify operation is performed to verify whether target populations of the selected memory cells have been programmed to level L2, L3, L4, or L5. For this program verify operation, the voltage applied to the selected access line equals the threshold voltage V5 for level L5. At time t4, a fifth program pulse, e.g., higher than the fourth program pulse, is applied to the selected access line connected to the control gates of the selected memory cells and the process repeats until the selected memory cells have been programmed to their target levels.

The voltage applied to the selected access line during each program verify operation might be selected based on the threshold voltages to be sensed during the program verify operation. In this example, as indicated at 380, the voltage level on each data line may be sensed to determine whether each respective memory cell coupled to the selected access line has been programmed to a selected target level for the respective memory cell within a range between the voltage level applied to the selected access line and the voltage level applied to the selected access line minus the voltage level (e.g., Vcc) applied to the common source. Thus, a voltage level of V5 applied to the selected access line might be used to verify the threshold voltages of memory cells programmed to levels L2, L3, L4, or L5, but not levels L0 or L1. Likewise, a voltage level of V7 applied to the selected access line might be used to verify the threshold voltages of memory cells programmed to levels L4, L5, L6, or L7, but not levels L0, L1, L2, or L3. Compared to prior methods for program verify operations where the voltage level applied to the selected access line is changed for each level to be sensed, the voltage level applied to the selected access line during a program verify operation as disclosed herein is constant for sensing multiple levels (e.g., three or more levels). Therefore, the period for each program verify operation is reduced, such that the overall programming time to program selected memory cells to their target levels is reduced.

Figure 9A:
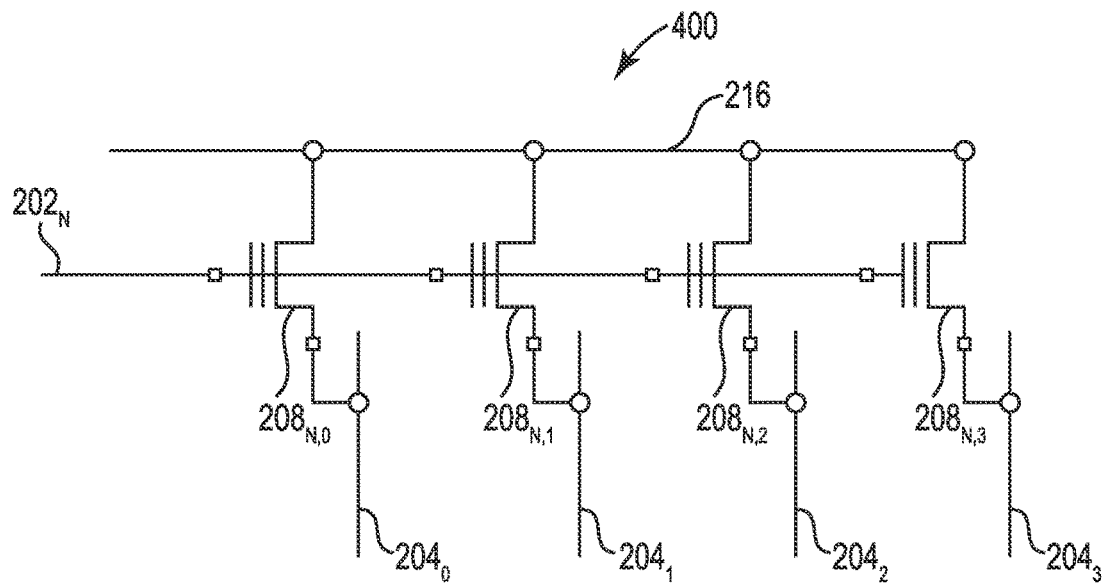
FIGS. 9A and 9B are schematics of a portion of an array of memory cells as could be used in a memory of the type described with reference to FIG. 1.

FIG. 9A is a schematic of a portion of an array of memory cells 400 as could be used in a memory of the type described with reference to FIG. 1, e.g., as a portion of array of memory cells 104. Like numbered elements in FIG. 9A correspond to the description as provided with respect to FIGS. 2A and 4. In this example, memory cells connected to even data lines $204_0$ and $204_2$ are programmed separately from memory cells connected to odd data lines $204_1$ and $204_3$. Accordingly, the even data lines $204_0$ and $204_2$ are selected and the odd data lines $204_1$ and $204_3$ are unselected to program memory cells connected to the even data lines $204_0$ and $204_2$. Likewise, the odd data lines $204_1$ and $204_3$ are selected and the even data lines $204_0$ and $204_2$ are unselected to program memory cells connected to the odd data lines $204_1$ and $204_3$. In this embodiment, the unselected data lines are used to suppress the sensed memory cell threshold voltage error due to the capacitive coupling between selected data lines in place of the shield lines or the shield plate previously described.

A selected data line is capacitively coupled to an adjacent selected data line. The capacitive coupling ratio between a selected data line (e.g., $204_0$) and an adjacent selected data line (e.g., $204_2$) is less than the capacitive coupling ratio between a selected data line (e.g., $204_0$) and an unselected data line (e.g., $204_1$). In one example, the capacitive coupling ratio between adjacent selected data lines may be within a range between 1% and 20%, and the capacitive coupling ratio between a selected data line and an unselected data line may be within a range between 70% and 90%. In other examples, the capacitive coupling ratio between adjacent selected data lines and the capacitive coupling ratio between a selected data line and an unselected data line may be within other suitable ranges.

FIG. 9A depicts four memory cells $208_{N,0}$ to $208_{N,3}$ connected to a selected access line $202_N$ during a program verify operation where either the even memory cells $208_{N,0}$ and $208_{N,2}$ or the odd memory cells $208_{N,1}$ and $208_{N,3}$ are selected for programming. In this example, it is presumed that the even memory cells $208_{N,0}$ and $208_{N,2}$ are selected for programming. While FIG. 9A includes two selected memory cells for simplicity, in other embodiments, any number of memory cells may be selected, such as a physical page of memory cells. During a program verify operation, the selected memory cells $208_{N,0}$ and $208_{N,2}$ are electrically connected to the common source 216 (e.g., via the other unselected memory cells within each respective NAND string $206_0$ and $206_2$ and the respective activated select gates $210_0$ and $210_2$). The selected memory cells $208_{N,0}$ and $208_{N,2}$ are also electrically connected to respective data lines $204_0$ and $204_2$ (e.g., via respective activated select gates $212_0$ and $212_2$).

Each memory cell $208_{N,0}$ to $208_{N,3}$ may be programmed to a different level, i.e., threshold voltage. For example, memory cell $208_{N,0}$ may be programmed to a first threshold voltage corresponding to level L1, memory cell $208_{N,1}$ may be programmed to a second threshold voltage corresponding to level L2, memory cell $208_{N,2}$ may be programmed to a third threshold voltage corresponding to level L3, and memory cell $208_{N,3}$ may be programmed to a fourth threshold voltage corresponding to level L4. During a program verify operation, the common source 216 may be biased to a first voltage (e.g., Vcc) and the selected access line $202_N$ may be biased to a second voltage (e.g., a voltage equal to the program verify threshold voltage for level L4).

Figure 9B:
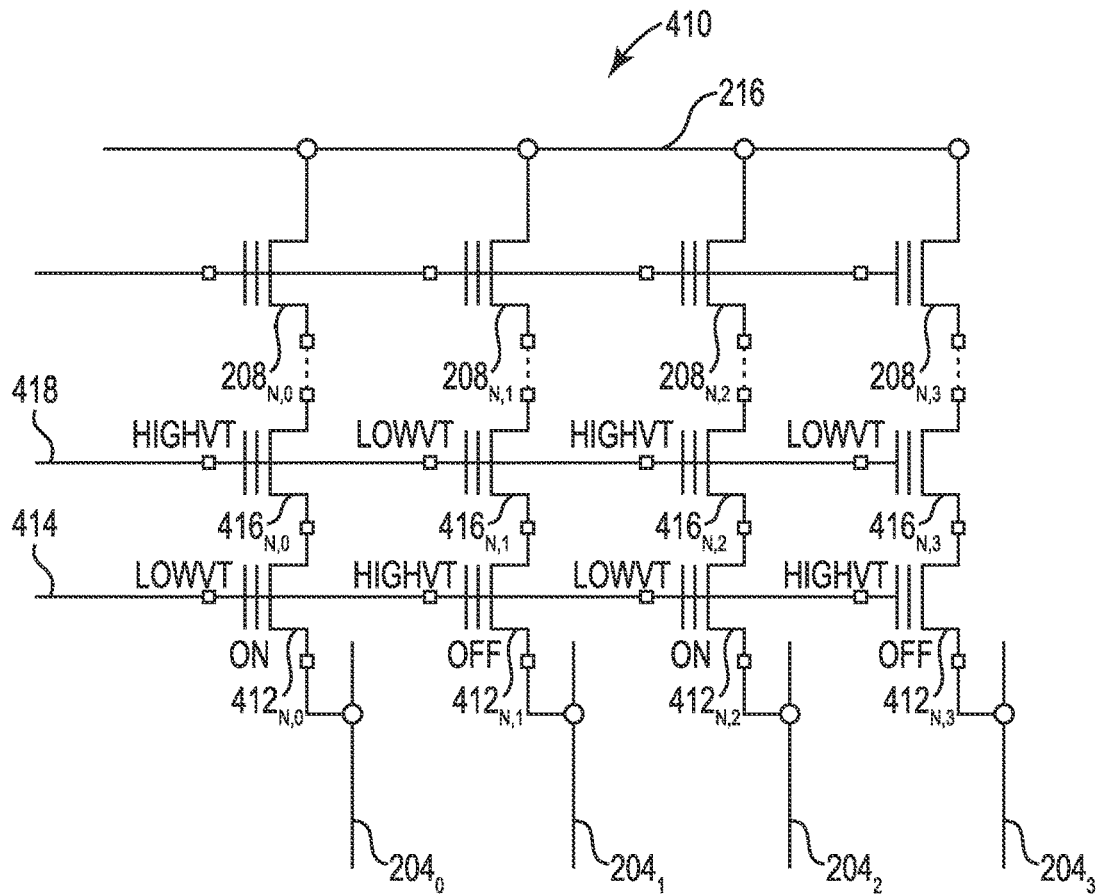

FIG. 9B is a schematic of a portion of an array of memory cells 410 as could be used in a memory of the type described with reference to FIG. 1, e.g., as a portion of array of memory cells 104. Array of memory cells 410 is similar to array of memory cells 400 previously described and illustrated with reference to FIG. 9A, except that array of memory cells 410 also includes first select gates (e.g., transistors) $412_{N,0}$ to $412_{N,3}$ and second select gates (e.g., transistors) $416_{N,0}$ to $416_{N,3}$. A first select line 414 (SG0) is connected to a control gate of each first select gate $412_{N,0}$ to $412_{N,3}$. A second select line 418 (SG1) is connected to a control gate of each second select gate $416_{N,0}$ to $416_{N,3}$. Even select gates $412_{N,0}$ and $412_{N,2}$ are connected to respective even data lines $204_0$ and $204_2$ and include a first threshold voltage (e.g., lowVt). Odd select gates $412_{N,1}$ and $412_{N,3}$ are connected to respective odd data lines $204_1$ and $204_3$ and include a second threshold voltage (e.g., highVt) greater than the first threshold voltage. Each second select gate $416_{N,0}$ to $416_{N,3}$ is connected between a respective first select gate $412_{N,1}$ and $412_{N,3}$ and a respective string of series-connected memory cells including the respective memory cells $208_{N,0}$ to $208_{N,3}$. Even select gates $416_{N,0}$ and $416_{N,2}$ include the second threshold voltage (e.g., highVt), and odd select gates $416_{N,1}$ and $416_{N,3}$ include the first threshold voltage (e.g., lowVt).

To select the even data lines $204_0$ and $204_2$ to program the even memory cells $208_{N,0}$ and $208_{N,2}$, the first select line 414 is deactivated and the second select line 418 is activated to turn on the even select gates $412_{N,0}$ and $412_{N,2}$ and even select gates $416_{N,0}$ and $416_{N,2}$. To select the odd data lines $204_1$ and $204_3$ to program odd memory cells $208_{N,1}$ and $208_{N,3}$, the first select line 414 is activated and the second select line 418 is deactivated to turn on odd select gates $412_{N,1}$ and $412_{N,3}$ and odd select gates $416_{N,1}$ and $416_{N,3}$. In this embodiment, due to the select gates $412_{N,1}$ to $412_{N,3}$ and $416_{N,0}$ to $416_{N,3}$, no current flows through the memory cells connected to the unselected data lines, even when the unselected data lines are biased as shield lines as described below.

Figure 10A:
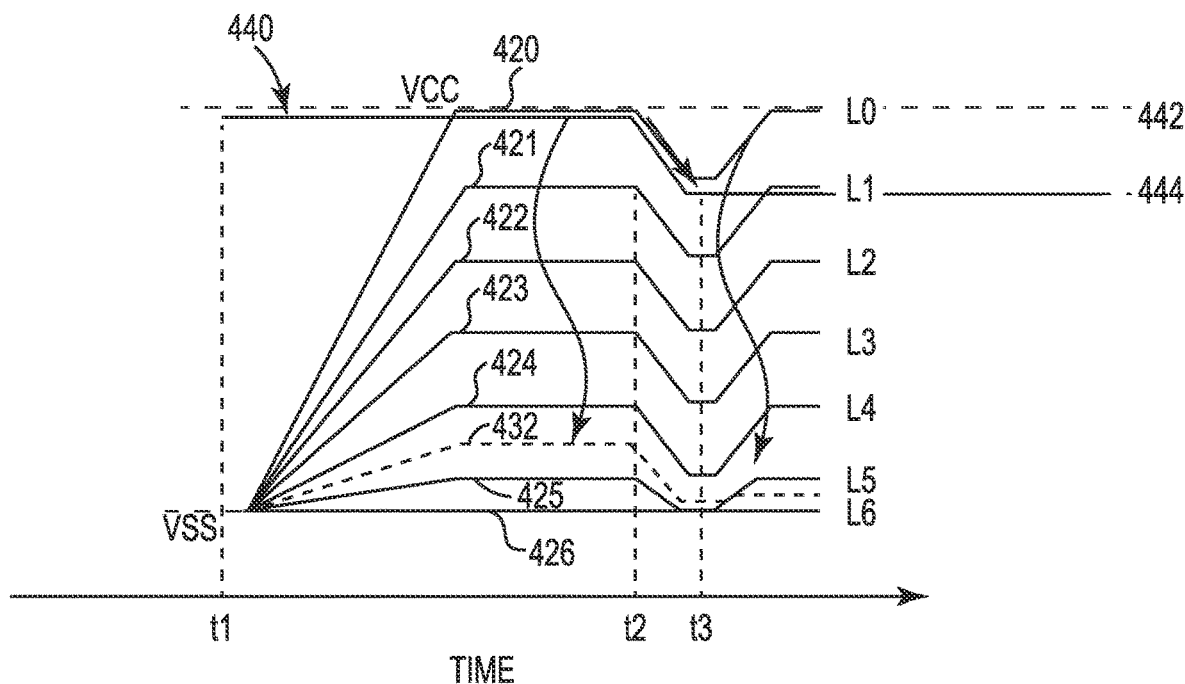
FIGS. 10A and 10B depict voltages on data lines connected to selected memory cells programmed to different threshold voltages during a program verify operation according to other embodiments.

FIG. 10A depicts voltages on selected data lines connected to selected memory cells programmed to different threshold voltages during a program verify operation according to another embodiment. To improve sensing accuracy, the capacitive coupling between unselected data lines and the selected data lines may be utilized to reduce the sensed memory cell threshold voltage error due to the capacitive coupling between adjacent selected data lines. Trace 440 indicates the voltage applied to the unselected data lines (e.g., odd data lines $204_1$ and $204_3$ of FIG. 9A or 9B) during a program verify operation. Also during the program verify operation, the common source is biased to a first voltage (e.g., Vcc) and the selected access line is biased to a second voltage (e.g., a voltage greater than or equal to the target threshold voltages being sensed). In this example, the voltages on seven selected data lines connected to seven selected memory cells each having a different threshold voltage corresponding to levels L0, L1, L2, L3, L4, L5, and L6 are illustrated. In other embodiments, however, the selected memory cells may include more than seven levels or less than seven levels.

During a program verify operation, the voltage on each data line starts from a reference voltage (e.g., Vss) and is then precharged through the selected memory cell such that a voltage indicative of the threshold voltage of the selected memory cell appears on the selected data line. That is, the voltage applied to the selected access line minus the threshold voltage of the selected memory cell appears on the respective selected data line absent any up or down coupling due to capacitive coupling between selected data lines or between the selected data lines and unselected data lines. Thus in this example, the voltage that appears on each data line varies between the reference voltage (e.g., Vss) for a selected memory cell programmed to level L6 (or level L7 not shown) that is turned off (due to a threshold voltage higher than the voltage applied to the selected access line) as indicated by trace 426 and the voltage applied to the common source for a selected memory cell programmed to level L0 having the lowest threshold voltage (e.g., 0V) as indicated by trace 420. The voltage on a selected data line for a selected memory cell programmed to level L1 is indicated by trace 421. The voltage on a selected data line for a selected memory cell programmed to level L2 is indicated by trace 422. The voltage on a selected data line for a selected memory cell programmed to level L3 is indicated by trace 423. The voltage on a selected data line for a selected memory cell programmed to level L4 is indicated at 424. The voltage on a selected data line for a selected memory cell programmed to level L5 is indicated at 425.

Due to capacitive coupling between selected data lines, however, as indicated for example between a selected data line connected to a selected memory cell programmed to level L0 and an adjacent selected data line connected to a selected memory cell programmed to level L6, the voltage that appears on the selected data line connected to the selected memory cell programmed to level L6 increases as indicated by dashed trace 432. The increase in the voltage on the selected data line corresponds to the capacitive coupling ratio and might contribute to a sensed memory cell threshold voltage error.

In this example during a program verify operation, prior to time t1, the unselected data lines are charged to a first voltage level as indicated at 442. The first voltage level might equal the voltage applied to the common source (e.g., Vcc). After time t1, with the unselected data lines charged to the first voltage level 422, the selected data lines (e.g., even data lines 204₀ and 204₂ of FIG. 9A or 9B) are precharged through the selected memory cells. Between times t2 and t3, the unselected data lines are discharged to a second voltage level as indicated at 444. The second voltage level 444 is less than the first voltage level 442. Due to capacitive coupling between the selected data lines and the unselected data lines, the voltage on each selected data line is also reduced. In the example of capacitive coupling between a selected data line connected to a memory cell programmed to level L0 and a selected data line connected to a memory cell programmed to level L6, the voltage on the selected data line connected to the memory cell programmed to level L6 as indicated by trace 432 is also reduced. After time t3, the selected data lines are recharged. Due to the capacitive coupling between the selected data lines, however, the increase in voltage on the selected data line connected to the memory cell programmed to level L6 remains lower after time t3 than before time t2, thereby suppressing the sensed memory cell threshold voltage error. The voltage on the unselected data lines may be further discharged to further suppress the sensed memory cell threshold voltage error.

Figure 10B:
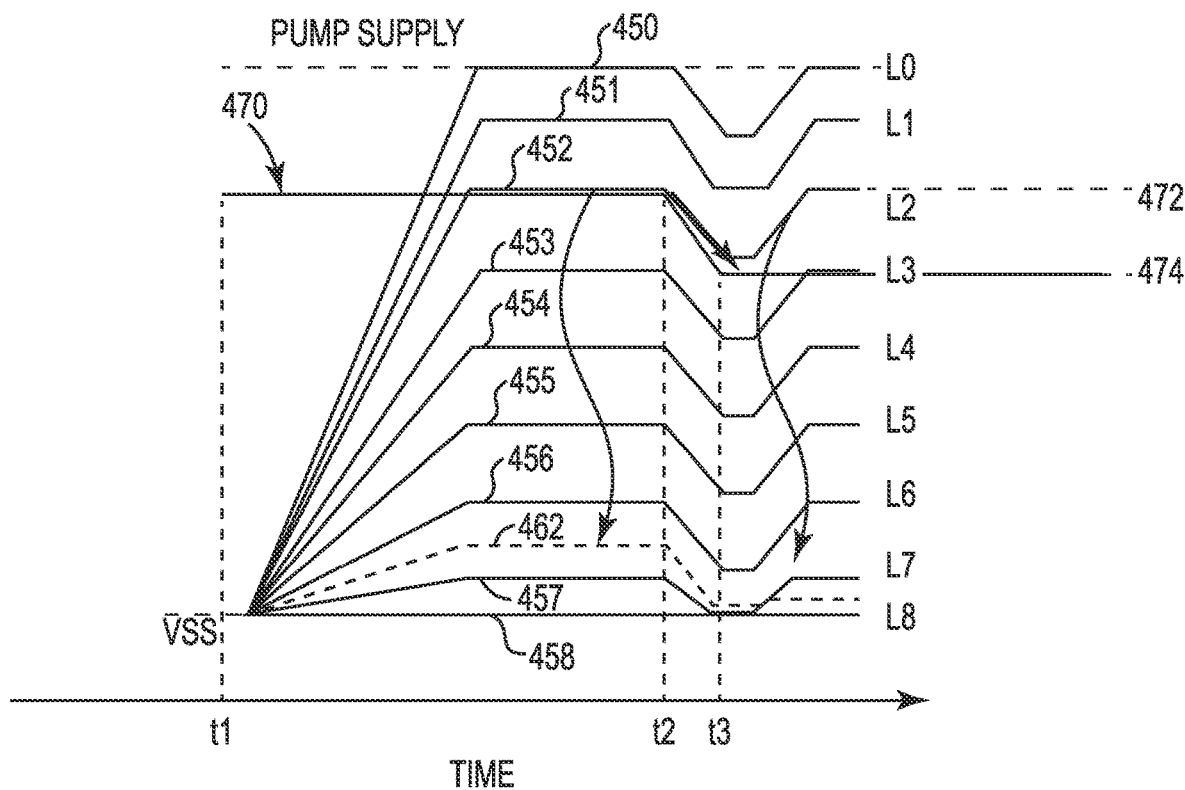

FIG. 10B depicts voltages on data lines connected to selected memory cells programmed to different threshold voltages during a program verify operation according to another embodiment. In this example, a boosted voltage (e.g., pump supply) may be applied to the common source to increase the number of levels that may be sensed between the reference voltage (e.g., Vss) and the boosted voltage. Trace 470 indicates the voltage applied to the unselected data lines (e.g., odd data lines), the shield lines, or the shield plate during a program verify operation. Also during the program verify operation, the common source is biased to a first voltage (e.g., pump supply) and the selected access line is biased to a second voltage (e.g., a voltage greater than or equal to the target threshold voltages being sensed). In this example, the voltages on nine selected data lines connected to nine selected memory cells each having a different threshold voltage corresponding to levels L0, L1, L2, L3, L4, L5, L6, L7, and L8 are illustrated. In other embodiments, however, the selected memory cells may include more than nine levels or less than nine levels.

During a program verify operation, the voltage on each data line starts from a reference voltage (e.g., Vss) and is then precharged through the selected memory cell such that a voltage indicative of the threshold voltage of the selected memory cell appears on the selected data line. That is, the voltage applied to the selected access line minus the threshold voltage of the selected memory cell appears on the respective selected data line absent any up or down coupling due to capacitive coupling between data lines or between the data lines and the shield lines or shield plate. Thus in this example, the voltage that appears on each data line varies between the reference voltage (e.g., Vss) for a memory cell programmed to level L8 that is turned off (due to a threshold voltage higher than the voltage applied to the selected access line) as indicated by trace 458 and the voltage applied to the common source for a memory cell programmed to level L0 having the lowest threshold voltage (e.g., 0V) as indicated by trace 450. The voltage on a data line for a selected memory cell programmed to level L1 is indicated by trace 451. The voltage on a data line for a selected memory cell programmed to level L2 is indicated by trace 452. The voltage on a data line for a selected memory cell programmed to level L3 is indicated by trace 453. The voltage on a data line for a selected memory cell programmed to level L4 is indicated at 454. The voltage on a data line for a selected memory cell programmed to level L5 is indicated at 455. The voltage on a data line for a selected memory cell programmed to level L6 is indicated at 456. The voltage on a data line for a selected memory cell programmed to level L7 is indicated at 457.

Due to capacitive coupling between data lines, however, as indicated for example between a data line connected to a selected memory cell programmed to level L0 and an adjacent data line connected to a selected memory cell programmed to level L8, the voltage that appears on the data line connected to the selected memory cell programmed to level L8 increases as indicated by dashed trace 462. The increase in the voltage on the data line corresponds to the capacitive coupling ratio and might contribute to a sensed memory cell threshold voltage error.

In this example during a program verify operation, prior to time t1, the unselected data lines, the shield lines, or the shield plate are charged to a first voltage level as indicated at 472. The first voltage level 472 might be between the reference voltage (e.g., Vss) and the boosted voltage applied to the common source. After time t1, with unselected data lines, the shield lines, or the shield plate charged to the first voltage 472, the selected data lines are precharged through the selected memory cells. Between times t2 and t3, the unselected data lines, the shield lines, or the shield plate are discharged to a second voltage level as indicated at 474. The second voltage level 474 is less than the first voltage level 472. Due to capacitive coupling between the selected data lines and the unselected data lines, the shield lines, or the shield plate, the voltage on each selected data line is also reduced. In the example of capacitive coupling between a selected data line connected to a memory cell programmed to level L0 and a selected data line connected to a memory cell programmed to level L8, the voltage on the selected data line connected to the memory cell programmed to level L8 as indicated by trace 462 is also reduced. After time t3, the selected data lines are recharged. Due to the capacitive coupling between the selected data lines, however, the increase in voltage on the selected data line connected to the memory cell programmed to level L8 remains lower after time t3 than before time t2, thereby suppressing the sensed memory cell threshold voltage error. The voltage on the unselected data lines, the shield lines, or the shield plate may be further reduced to further suppress sensed memory cell threshold voltage error.

Figure 11A:
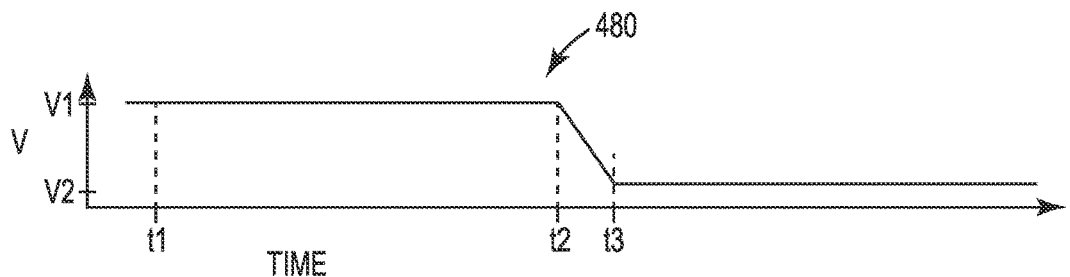
FIGS. 11A-11E are waveforms depicting voltage levels applied to shield lines, a shield plate, or unselected data lines during a program verify operation according to embodiments.

FIG. 11A is a waveform 480 depicting voltage levels applied to shield lines, a shield plate, or unselected data lines during a program verify operation according to an embodiment. Prior to time t1, the shield lines, the shield plate, or the unselected data lines are charged to a first voltage level V1. The selected data lines are then precharged through the selected memory cells as previously described. With the selected data lines precharged, between times t2 and t3 the shield lines, the shield plate, or the unselected data lines are discharged (e.g., linearly driven down) to a second voltage level V2 less than the first voltage level V1. The selected data lines are then recharged through the selected memory cells. After time t3, the shield lines, the shield plate, or the unselected data lines are maintained at the second voltage level V2 until the program verify operation is complete. The shape of waveform 480 is similar to the shape of traces 360 of FIG. 7, 440 of FIG. 10A, and 470 of FIG. 10B.

Figure 11B:
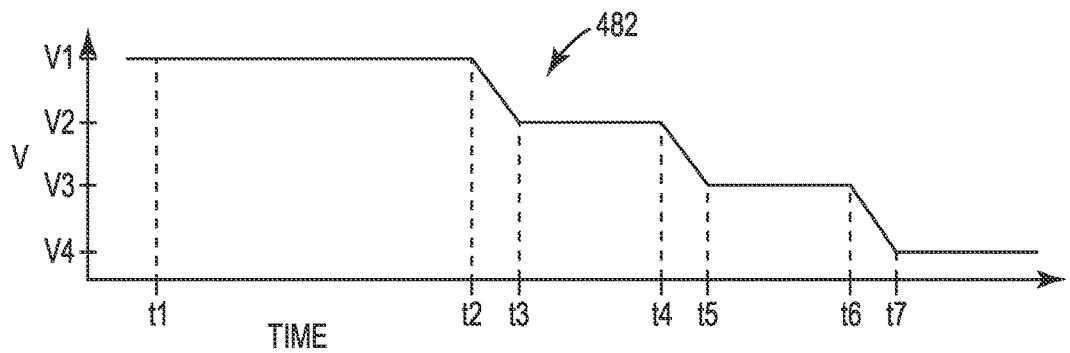

FIG. 11B is a waveform 482 depicting voltage levels applied to shield lines, a shield plate, or unselected data lines during a program verify operation according to another embodiment. Prior to time t1, the shield lines, the shield plate, or the unselected data lines are charged to a first voltage level V1. The selected data lines are then precharged through the selected memory cells as previously described. With the selected data lines precharged, between times t2 and t3 the shield lines, the shield plate, or the unselected data lines are discharged (e.g., linearly driven down) to a second voltage level V2 less than the first voltage level V1. The selected data lines are then reprecharged through the selected memory cells. With the selected data lines reprecharged, between times t4 and t5 the shield lines, the shield plate, or the unselected data lines are discharged (e.g., linearly driven down) to a third voltage level V3 less than the second voltage level V2. The selected data lines are then again reprecharged through the selected memory cells. With the selected data lines again reprecharged, between times t6 and t7 the shield lines, the shield plate, or the unselected data lines are again discharged (e.g., linearly driven down) to a fourth voltage level V4 less than the third voltage level V3. The selected data lines are then again reprecharged through the selected memory cells. After time t7, the shield lines, the shield plate, or the unselected data lines are maintained at the fourth voltage level V4 until the program verify operation is complete.

In this embodiment, the difference between the first voltage level V1 and the second voltage level V2, the difference between the second voltage level V2 and the third voltage level V3, and the difference between the third voltage level V3 and the fourth voltage level V4 are equal. The shape of waveform 482 may be applied to trace 360 of FIG. 7, trace 440 of FIG. 10A, and/or trace 470 of FIG. 10B to further suppress the sensed memory cell threshold voltage error due to capacitive coupling between selected data lines.

Figure 11C:
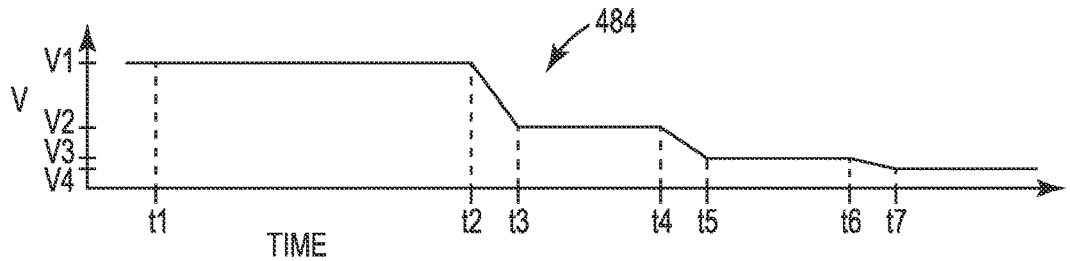

FIG. 11C is a waveform 484 depicting voltage levels applied to shield lines, a shield plate, or unselected data lines during a program verify operation according to another embodiment. Prior to time t1, the shield lines, the shield plate, or the unselected data lines are charged to a first voltage level V1. The selected data lines are then precharged through the selected memory cells as previously described. With the selected data lines precharged, between times t2 and t3 the shield lines, the shield plate, or the unselected data lines are discharged (e.g., linearly driven down) to a second voltage level V2 less than the first voltage level V1. The selected data lines are then reprecharged through the selected memory cells. With the selected data lines reprecharged, between times t4 and t5 the shield lines, the shield plate, or the unselected data lines are discharged (e.g., linearly driven down) to a third voltage level V3 less than the second voltage level V2. The selected data lines are then again reprecharged through the selected memory cells. With the selected data lines reprecharged, between times t6 and t7 the shield lines, the shield plate, or the unselected data lines are again discharged (e.g., linearly driven down) to a fourth voltage level V4 less than the third voltage level V3. The selected data lines are then again reprecharged through the selected memory cells. After time t7, the shield lines, the shield plate, or the unselected data lines are maintained at the fourth voltage level V4 until the program verify operation is complete.

In this embodiment, the difference between the first voltage level V1 and the second voltage level V2 is greater than the difference between the second voltage level V2 and the third voltage level V3, and the difference between the second voltage level V2 and the third voltage level V3 is greater than the difference between the third voltage level V3 and the fourth voltage level V4. The shape of waveform 482 may be applied to trace 360 of FIG. 7, trace 440 of FIG. 10A, and/or trace 470 of FIG. 10B to further suppress the sensed memory cell threshold voltage error due to capacitive coupling between selected data lines.

In a specific example, the capacitive coupling ratio between adjacent selected data lines might be 10%, the capacitive coupling ratio between each selected data line and the shield lines, the shield plate, or the unselected data lines might be 80%, and the voltage on a selected data line connected to a selected memory cell programmed to level L0 might be precharged to 2.5V. Thus, the voltage on the data line connected to a selected memory cell programmed to level L6 may be increased by 250 mV before time t2. The first voltage level V1 applied to the shield lines, the shield plate, or the unselected data lines may be 1.5V. The shield lines, the shield plate, or the unselected data lines may then be driven down between times t2 and t3 by 300 mV to the second voltage level V2. Thus, the voltage on each data line is reduced by 300 mV times 80%, which equals 240 mV between times t2 and t3. Each data line is then reprecharged after time t3. Therefore, the voltage on the data line connected to the memory cell programmed to level L6 increases by 240 mV times 10%, which equals 24 mV.

The shield lines, the shield plate, or the unselected data lines may then be driven down between times t4 and t5 by an additional 30 mV to the third voltage level V3. Thus, the voltage on each data line is reduced by 30 mV times 80%, which equals 24 mV between times t4 and t5. Each data line is then reprecharged after time t5. Therefore, the voltage of the data line connected to the memory cell programmed to level L6 is reduced by 24 mV times 10%, which equals 2.4 mV. Each data line is then reprecharged after time t3. The shield lines, the shield plate, or the unselected data lines may then be driven down between times t6 and t7 by an additional 3 mV to the fourth voltage level V4. Thus, the voltage on each data line is reduced by 3 mV times 80%, which equals 2.4 mV between times t6 and t7. Each data line is then reprecharged after time t7. Therefore, the voltage on the data line connected to the memory cell programmed to level L6 increases by 2.4 mV times 10%, which equals 0.24 mV. Accordingly, the sensed memory cell threshold voltage error due to the capacitive coupling between adjacent data lines is suppressed from 250 mV to 0.24 mV.

Figure 11D:
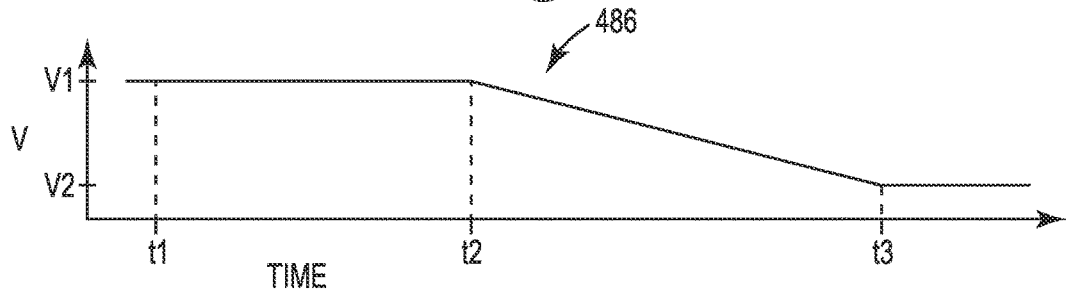

FIG. 11D is a waveform 486 depicting voltage levels applied to shield lines, a shield plate, or unselected data lines during a program verify operation according to another embodiment. Prior to time t1, the shield lines, the shield plate, or the unselected data lines are charged to a first voltage level V1. The selected data lines are then precharged through the selected memory cells as previously described. With the selected data lines precharged, between times t2 and t3 the shield lines, the shield plate, or the unselected data lines are discharged (e.g., linearly driven down) to a second voltage level V2 less than the first voltage level V1. The selected data lines are then reprecharged through the selected memory cells. After time t3, the shield lines, shield plate, or the unselected data lines are maintained at the second voltage level V2 until the program verify operation is complete. In this embodiment, the voltage applied to the shield lines, the shield plate, or the unselected data lines is gradually reduced from the first voltage level V1 to the second voltage level V2 such that the period between times t2 and t3 in FIG. 11D is greater than (e.g., 2, 3, 4, 5, etc., times greater than) the period between times t2 and t3 of FIG. 11A. The shape of waveform 486 may be applied to trace 360 of FIG. 7, trace 440 of FIG. 10A, and/or trace 470 of FIG. 10B.

Figure 11E:
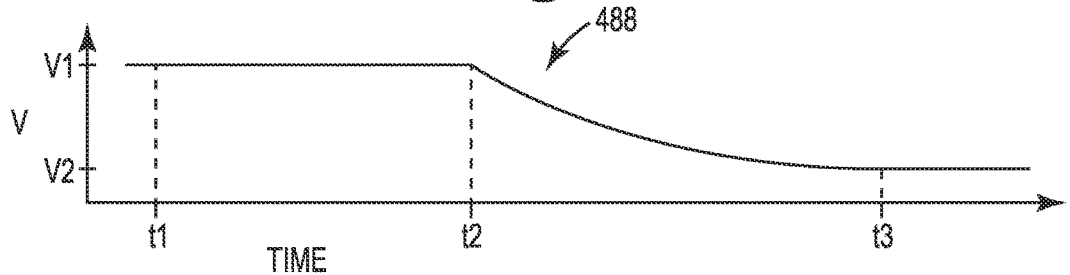

FIG. 11E is a waveform 488 depicting voltage levels applied to shield lines, a shield plate, or unselected data lines during a program verify operation according to another embodiment. Prior to time t1, the shield lines, the shield plate, or the unselected data lines are charged to a first voltage level V1. The selected data lines are then precharged through the selected memory cells as previously described. With the selected data lines precharged, between times t2 and t3 the shield lines, the shield plate, or the unselected data lines are non-linearly (e.g., exponentially) discharged (e.g., driven down) to a second voltage level V2 less than the first voltage level V1. The selected data lines are then recharged through the selected memory cells. After time t3, the shield lines, the shield plate, or the unselected data lines are maintained at the second voltage level V2 until the program verify operation is complete. In this embodiment, the voltage applied to the shield lines, the shield plate, or unselected data lines is gradually reduced from the first voltage level V1 to the second voltage level V2 such that the period between times t2 and t3 in FIG. 11E is greater than (e.g., 2, 3, 4, 5, etc., times greater than) the period between times t2 and t3 of FIG. 11A. The shape of waveform 488 may be applied to trace 360 of FIG. 7, trace 440 of FIG. 10A, and/or trace 470 of FIG. 10B.

Figure 12:
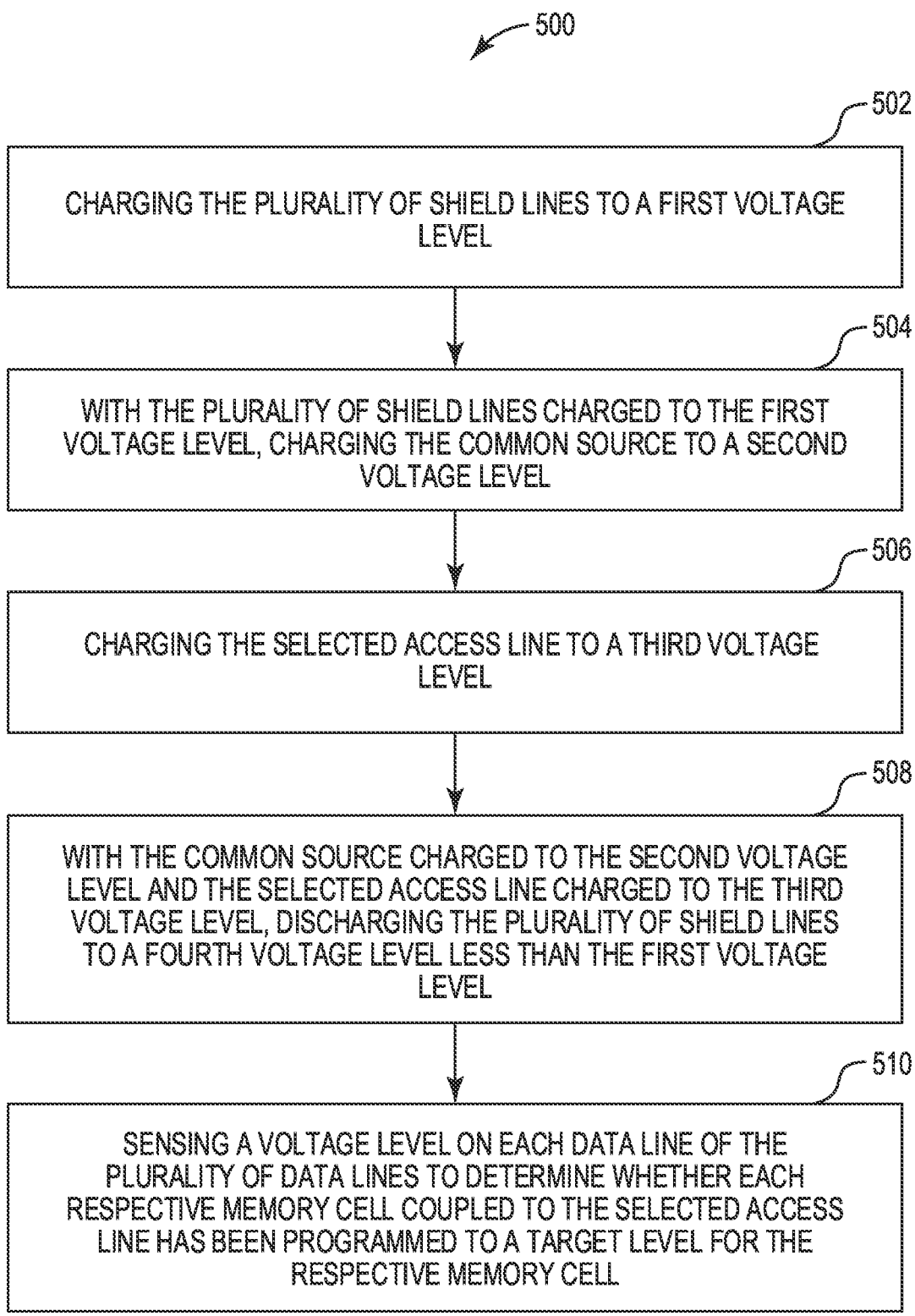
FIG. 12 is a flowchart of a method of operating a memory in accordance with an embodiment.

FIG. 12 is a flowchart of a method 500 of operating a memory in accordance with an embodiment. Method 500 might be implemented by control logic 116 of memory device 100 of FIG. 1 and may correspond at least in part to FIGS. 7 and 10B. For example, FIG. 12 might represent a method of sensing, e.g., reading or verifying, one or more memory cells, e.g., a logical page of memory cells. The method might be in the form of computer-readable instructions, e.g., stored to the instruction registers 128. Such computer-readable instructions might be executed by a controller, e.g., the control logic 116, to cause the memory device 100 to perform the method.

Method 500 might be implemented within a memory device (e.g., 100) including an array of memory cells (e.g., 104) including a plurality of strings of series-connected memory cells (e.g., 206); a plurality of access lines (e.g., 202), where each access line might be connected to a control gate (e.g., 236) of a respective memory cell (e.g., 208) of each string of series-connected memory cells; a common source (e.g., 216); a plurality of data lines (e.g., 204), wherein each string of series-connected memory cells might be selectively electrically connected between the common source and a respective data line; and a plurality of shield lines (e.g., 322) interleaved with the plurality of data lines as previously described at least with reference to FIGS. 1, 2A, and 4.

The control logic may be configured to implement method 500 to perform a program verify operation of respective memory cells coupled to a selected access line of the plurality of access lines. At 502, method 500 may include charging the plurality of shield lines to a first voltage level. At 504, method 500 may include with the plurality of shield lines charged to the first voltage level, charging the common source to a second voltage level. In one example, the second voltage level may include a boosted supply voltage level. At 506, method 500 may include charging the selected access line to a third voltage level. In one example, the first voltage level may be less than the second voltage level and the third voltage level may be less than or equal to the second voltage level. At 508, method 500 may include with the common source charged to the second voltage level and the selected access line charged to the third voltage level, discharging the plurality of shield lines to a fourth voltage level less than the first voltage level. At 510, method 500 may include sensing a voltage level on each data line of the plurality of data lines to determine whether each respective memory cell coupled to the selected access line has been programmed to a target level for the respective memory cell.

In one example, sensing the voltage level on each data line may include sensing the voltage level on each line of the plurality of data lines to determine whether each respective memory cell coupled to the selected access line has been programmed to a selected target level for the respective memory cell within a range between the third voltage level and the third voltage level minus the second voltage level. Method 500 may also include discharging the plurality of shield lines to a fifth voltage level less than the fourth voltage level prior to sensing the voltage level on each data line of the plurality of data lines. Method 500 may also include prior to the program verify operation, applying a program pulse to the selected access line.

Figure 13:
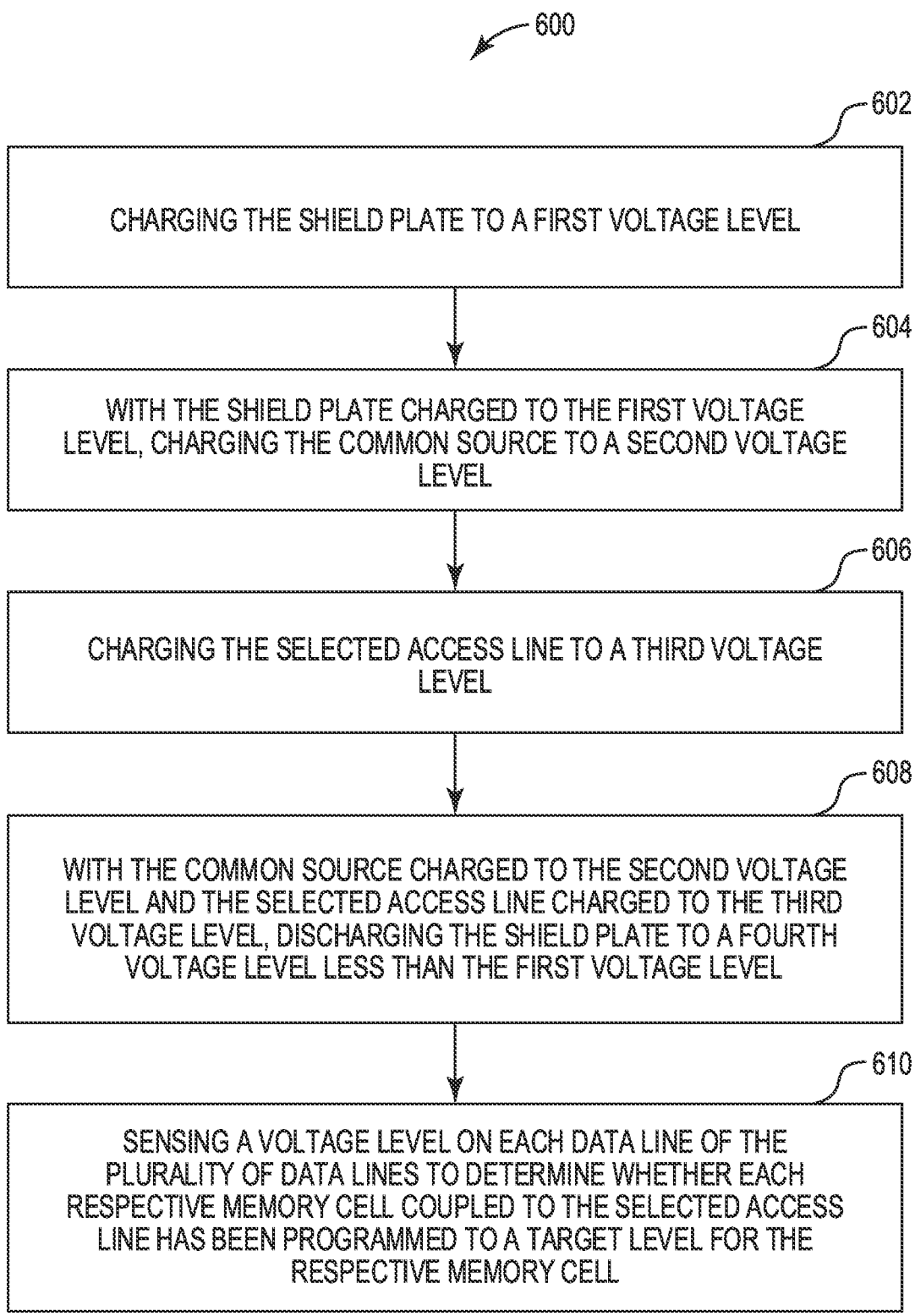
FIG. 13 is a flowchart of a method of operating a memory in accordance with another embodiment.

FIG. 13 is a flowchart of a method 600 of operating a memory in accordance with another embodiment. Method 600 might be implemented by control logic 116 of memory device 100 of FIG. 1 and may correspond at least in part to FIGS. 7 and 10B. For example, FIG. 13 might represent a method of sensing, e.g., reading or verifying, one or more memory cells, e.g., a logical page of memory cells. The method might be in the form of computer-readable instructions, e.g., stored to the instruction registers 128. Such computer-readable instructions might be executed by a controller, e.g., the control logic 116, to cause the memory device 100 to perform the method.

Method 600 might be implemented within a memory device (e.g., 100) including an array of memory cells (e.g., 104) including a plurality of strings of series-connected memory cells (e.g., 206); a plurality of access lines (e.g., 202), wherein each access line might be connected to a control gate (e.g., 236) of a respective memory cell (e.g., 208) of each string of series-connected memory cells; a common source (e.g., 216); a plurality of data lines (e.g., 204), wherein each string of series-connected memory cells might be selectively electrically connected between the common source and a respective data line; and a shield plate (e.g., 332) adjacent to the plurality of data lines as previously described at least with reference to FIGS. 1, 2A, and 5.

The control logic may be configured to implement method 500 to perform a program verify operation of respective memory cells coupled to a selected access line of the plurality of access lines. At 602, method 600 may include charging the shield plate to a first voltage level. At 604, method 600 may include with the shield plate charged to the first voltage level, charging the common source to a second voltage level. In one example, the second voltage level may include a boosted supply voltage level. At 606, method 600 may include charging the selected access line to a third voltage level. In one example, the first voltage level may be less than the second voltage level and the third voltage level may be less than or equal to the second voltage level. At 608, method 600 may include with the common source charged to the second voltage level and the selected access line charged to the third voltage level, discharging the shield plate to a fourth voltage level less than the first voltage level. At 610, method 600 may include sensing a voltage level on each data line of the plurality of data lines to determine whether each respective memory cell coupled to the selected access line has been programmed to a target level for the respective memory cell.

In one example, sensing the voltage level on each data line may include sensing the voltage level on each data line of the plurality of data lines to determine whether each respective memory cell coupled to the selected access line has been programmed to a selected target level for the respective memory cell within a range between the third voltage level and the third voltage level minus the second voltage level. Method 600 may also include discharging the shield plate to a fifth voltage level less than the fourth voltage level prior to sensing the voltage level on each data line of the plurality of data lines. Method 600 may also include prior to the program verify operation, applying a program pulse to the selected access line.

Figure 14:
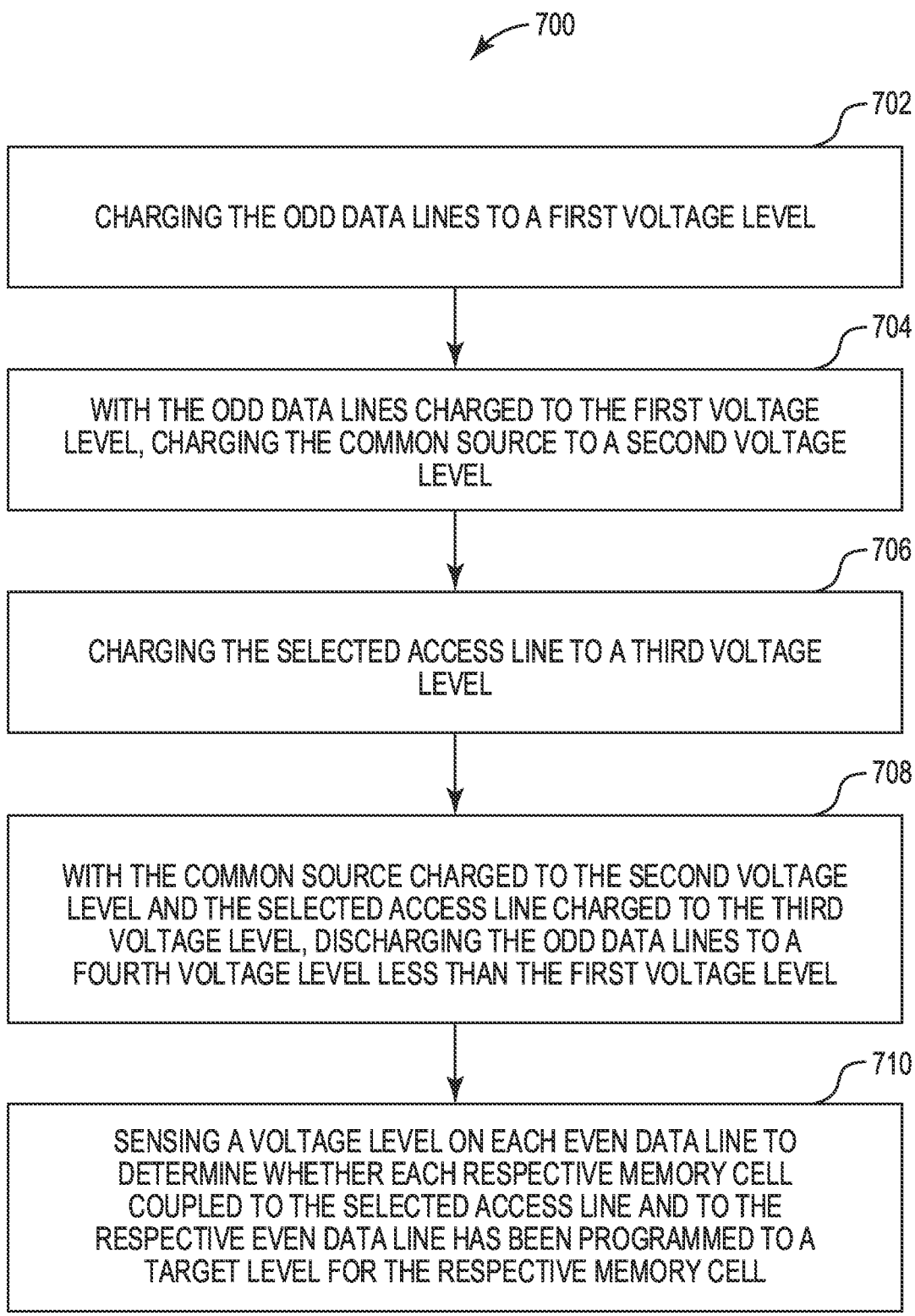
FIG. 14 is a flowchart of a method of operating a memory in accordance with another embodiment.

FIG. 14 is a flowchart of a method 700 of operating a memory in accordance with another embodiment. Method 700 might be implemented by control logic 116 of memory device 100 of FIG. 1 and may correspond at least in part to FIGS. 10A and 10B. For example, FIG. 14 might represent a method of sensing, e.g., reading or verifying, one or more memory cells, e.g., a logical page of memory cells. The method might be in the form of computer-readable instructions, e.g., stored to the instruction registers 128. Such computer-readable instructions might be executed by a controller, e.g., the control logic 116, to cause the memory device 100 to perform the method.

Method 700 might be implemented within a memory device (e.g., 100) including an array of memory cells (e.g., 104) including a plurality of strings of series-connected memory cells (e.g., 206); a plurality of access lines (e.g., 202), wherein each access line might be connected to a control gate (e.g., 236) of a respective memory cell (e.g., 208) of each string of series-connected memory cells; a common source (e.g., 216); and a plurality of data lines (e.g., 204) including even data lines and odd data lines, wherein each string of series-connected memory cells might be selectively electrically connected between the common source and a respective data line of the plurality of data lines as previously described at least with reference to FIGS. 1, 2A, 9A, and 9B.

The control logic may be configured to implement method 700 to perform a program verify operation of respective memory cells coupled to a selected access line of the plurality of access lines and to a respective even data line. At 702, method 700 may include charging the odd data lines to a first voltage level. At 704, method 700 may include with the odd data lines charged to the first voltage level, charging the common source to a second voltage level. In one example, the second voltage level may include a boosted supply voltage level. At 706, method 700 may include charging the selected access line to a third voltage level. In one example, the first voltage level may be less than or equal to the second voltage level and the third voltage level may be less than or equal to the second voltage level. At 708, method 700 may include with the common source charged to the second voltage level and the selected access line charged to the third voltage level, discharging the odd data lines to a fourth voltage level less than the first voltage level. At 710, method 700 may include sensing a voltage level on each even data line to determine whether each respective memory cell coupled to the selected access line and to the respective even data line has been programmed to a target level for the respective memory cell.

In one example, sensing the voltage level on each even data line may include sensing the voltage level on each even data line to determine whether each respective memory cell coupled to the selected access line and to the respective even data line has been programmed to a selected target level for the respective memory cell within a range between the third voltage level and the third voltage level minus the second voltage level. Method 700 may also include discharging the odd data lines to a fifth voltage level less than the fourth voltage level prior to sensing the voltage level on each even data line. Method 700 may also include prior to the program verify operation, applying a program pulse to the selected access line.

The memory device within which method 700 is implemented may further include a plurality of first select gates (e.g., 412) connected to respective data lines, wherein the plurality of first select gates include first even select gates connected to respective even data lines and having a first threshold voltage and first odd select gates connected to respective odd data lines and having a second threshold voltage greater than the first threshold voltage; and a plurality of second select gates (e.g., 416) connected between a respective first select gate and a respective string of series-connected memory cells, wherein the plurality of second select gates include second even select gates connected to respective first even select gates and having the second threshold voltage and second odd select gates connected to respective first odd select gates and having the first threshold voltage as previously described with reference to FIG. 9B. In this embodiment, method 700 may further include turning on the first even select gates and turning off the first odd select gates prior to charging the odd data lines to the first voltage level.

Figure 15:
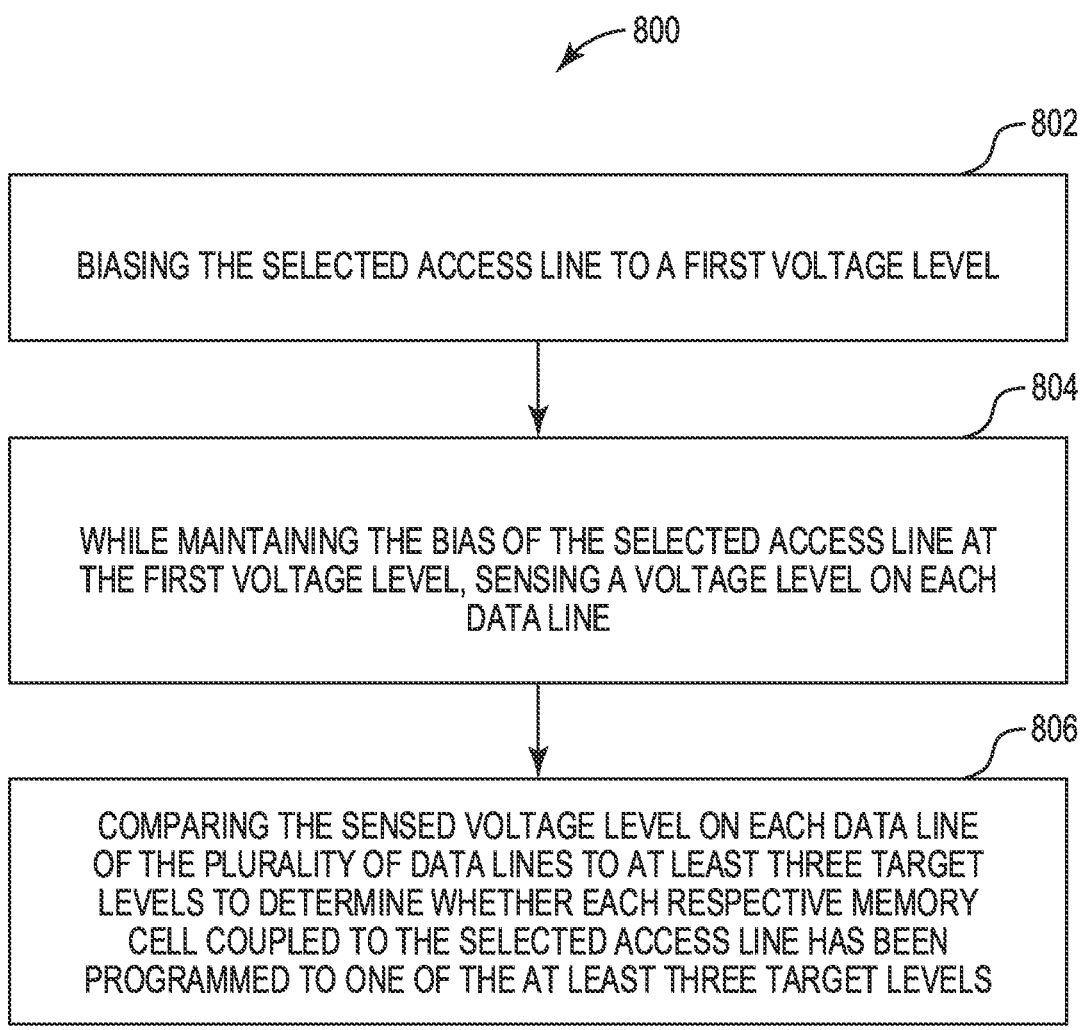
FIG. 15 is a flowchart of a method of operating a memory in accordance with another embodiment.

FIG. 15 is a flowchart of a method 800 of operating a memory in accordance with another embodiment. Method 800 might be implemented by control logic 116 of memory device 100 of FIG. 1 and may correspond at least in part to FIGS. 7, 10A, and 10B. For example, FIG. 15 might represent a method of sensing, e.g., reading or verifying, one or more memory cells, e.g., a logical page of memory cells. The method might be in the form of computer-readable instructions, e.g., stored to the instruction registers 128. Such computer-readable instructions might be executed by a controller, e.g., the control logic 116, to cause the memory device 100 to perform the method.

Method 700 might be implemented within a memory device (e.g., 100) including an array of memory cells (e.g., 104) including a plurality of strings of series-connected memory cells (e.g., 206); a plurality of access lines (e.g., 202), wherein each access line might be connected to a control gate (e.g., 236) of a respective memory cell (e.g., 208) of each string of series-connected memory cells; a common source (e.g., 216); and a plurality of data lines (e.g., 204), wherein each string of series-connected memory cells might be selectively electrically connected between the common source and a respective data line as previously described at least with reference to FIGS. 1, 2A, 4, 5, 9A, and 9B.

The control logic may be configured to implement method 800 to perform a program verify operation of respective memory cells coupled to a selected access line of the plurality of access lines. At 802, method 800 may include biasing the selected access line to a first voltage level. At 804, method 800 may include while maintaining the bias of the selected access line at the first voltage level, sensing a voltage level on each data line of the plurality of data lines. At 806, method 800 may include comparing the sensed voltage level on each data line of the plurality of data lines to at least three target levels to determine whether each respective memory cell coupled to the selected access line has been programmed to one of the at least three target levels.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
   an array of memory cells;
   a plurality of access lines connected to the array of memory cells;
   a plurality of data lines connected to the array of memory cells;
   a plurality of shield lines interleaved with the plurality of data lines; and
   control logic configured to implement a program verify operation of respective memory cells of the array of memory cells connected to a selected access line of the plurality of access lines comprising:
      charging the plurality of shield lines to a first voltage level;
      discharging the plurality of shield lines to a fourth voltage level less than the first voltage level; and
      sensing a voltage level on each data line of the plurality of data lines to determine whether each respective memory cell connected to the selected access line has been programmed to a target level for the respective memory cell.

2. The memory device of claim 1, wherein the plurality of shield lines are capacitively coupled to the plurality of data lines.

3. The memory device of claim 2, wherein a capacitive coupling ratio between a data line of the plurality of data lines and a shield line of the plurality of shield lines is greater than a capacitive coupling ratio between a first data line of the plurality of data lines and a second data line of the plurality of data lines.

4. The memory device of claim 1, wherein prior to the program verify operation, the control logic is configured to apply a program pulse to the selected access line.

5. The memory device of claim 1, further comprising:
   a common source connected to the array of memory cells, wherein the control logic is further configured to:
      with the plurality of shield lines charged to the first voltage level, charging the common source to a second voltage level; and
      charging the selected access line to a third voltage level,
      wherein discharging the plurality of shield lines comprises discharging the plurality of shield lines to the fourth voltage level with the common source charged to the second voltage level and the selected access line charged to the third voltage level.

6. The memory device of claim 5, wherein the control logic is configured to sense the voltage level on each data line of the plurality of data lines to determine whether each respective memory cell connected to the selected access line has been programmed to a selected target level for the respective memory cell within a range between the third voltage level and the third voltage level minus the second voltage level.

7. The memory device of claim 5, wherein the first voltage level is less than the second voltage level and the third voltage level is less than or equal to the second voltage level.

8. A memory device comprising:
   an array of memory cells;
   a plurality of access lines connected to the array of memory cells;
   a plurality of data lines connected to the array of memory cells;
   a shield plate adjacent to the plurality of data lines; and
   control logic configured to implement a program verify operation of respective memory cells of the array of memory cells connected to a selected access line of the plurality of access lines comprising:
      charging the shield plate to a first voltage level;
      discharging the shield plate to a fourth voltage level less than the first voltage level; and
      sensing a voltage level on each data line of the plurality of data lines to determine whether each respective memory cell connected to the selected access line has been programmed to a target level for the respective memory cell.

9. The memory device of claim 8, wherein the shield plate is capacitively coupled to the plurality of data lines.

10. The memory device of claim 8, wherein a capacitive coupling ratio between each data line of the plurality of data lines and the shield plate is greater than a capacitive coupling ratio between a first data line of the plurality of data lines and a second data line of the plurality of data lines.

11. The memory device of claim 8, wherein prior to the program verify operation, the control logic is configured to apply a program pulse to the selected access line.

12. The memory device of claim 8, further comprising:
   a common source connected to the array of memory cells, wherein the control logic is further configured to:
      with the shield plate charged to the first voltage level, charging the common source to a second voltage level; and
      charging the selected access line to a third voltage level,
      wherein discharging the shield plate comprises discharging the shield plate to the fourth voltage level with the common source charged to the second voltage level and the selected access line charged to the third voltage level.

13. The memory device of claim 12, wherein the control logic is configured to sense the voltage level on each data line of the plurality of data lines to determine whether each respective memory cell connected to the selected access line has been programmed to a selected target level for the respective memory cell within a range between the third voltage level and the third voltage level minus the second voltage level.

14. The memory device of claim 12, wherein the first voltage level is less than the second voltage level and the third voltage level is less than or equal to the second voltage level.

15. A memory device comprising:
   an array of memory cells;
   a plurality of access lines connected to the array of memory cells;
   a plurality of data lines comprising even data lines and odd data lines connected to the array of memory cells; and
   control logic configured to implement a program verify operation of respective memory cells of the array of memory cells connected to a selected access line of the plurality of access lines and to a respective even data line comprising:
      charging the odd data lines to a first voltage level;
      discharging the odd data lines to a fourth voltage level less than the first voltage level; and sensing a voltage level on each even data line to determine whether each respective memory cell connected to the selected access line and to the respective even data line has been programmed to a target level for the respective memory cell.

16. The memory device of claim 15, wherein prior to the program verify operation, the control logic is configured to apply a program pulse to the selected access line.

17. The memory device of claim 15, further comprising:
a common source connected to the array of memory cells, wherein the control logic is further configured to:
with the odd data lines charged to the first voltage level, charging the common source to a second voltage level; and
charging the selected access line to a third voltage level,
wherein discharging the odd data lines comprises discharging the odd data lines to the fourth voltage level with the common source charged to the second voltage level and the selected access line charged to the third voltage level.

18. The memory device of claim 17, wherein the control logic is configured to sense the voltage level on each even data line to determine whether each respective memory cell connected to the selected access line and to the respective even data line has been programmed to a selected target level for the respective memory cell within a range between the third voltage level and the third voltage level minus the second voltage level.

19. The memory device of claim 17, wherein the first voltage level is less than or equal to the second voltage level and the third voltage level is less than or equal to the second voltage level.

20. The memory device of claim 15, further comprising:
a plurality of first transistors connected to respective data lines of the plurality of data lines, the plurality of first transistors comprising first even transistors connected to respective even data lines and comprising a first threshold voltage and first odd transistors connected to respective odd data lines and comprising a second threshold voltage greater than the first threshold voltage; and
a plurality of second transistors connected between a respective first transistor of the plurality of first transistors and the array of memory cells, the plurality of second transistors comprising second even transistors connected to respective first even transistors and comprising the second threshold voltage and second odd transistors connected to respective first odd transistors and comprising the first threshold voltage.

* * * * *